United States Patent
Takahashi et al.

(10) Patent No.: US 9,679,938 B2
(45) Date of Patent: *Jun. 13, 2017

(54) SEMICONDUCTOR DEVICE, MANUFACTURING METHOD THEREOF, AND ELECTRONIC APPARATUS

(71) Applicant: Sony Corporation, Tokyo (JP)

(72) Inventors: Hiroshi Takahashi, Kanagawa (JP); Taku Umebayashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/211,985

(22) Filed: Jul. 15, 2016

(65) Prior Publication Data

US 2016/0329370 A1    Nov. 10, 2016

Related U.S. Application Data

(63) Continuation of application No. 14/451,809, filed on Aug. 5, 2014, now Pat. No. 9,419,041, which is a (Continued)

(30) Foreign Application Priority Data

Oct. 29, 2009  (JP) ................. 2009-249327

(51) Int. Cl.
  *H01L 27/146*  (2006.01)
  *H01L 21/768*  (2006.01)
  (Continued)

(52) U.S. Cl.
  CPC .. *H01L 27/14636* (2013.01); *H01L 21/76898* (2013.01); *H01L 23/481* (2013.01);
  (Continued)

(58) Field of Classification Search
  CPC ............. H01L 27/146; H01L 27/14636; H01L 27/14638; H01L 27/1464; H01L 27/14634
  See application file for complete search history.

(56) References Cited

U.S. PATENT DOCUMENTS 5,889,302 A    3/1999  Liu
6,448,174 B1   9/2002  Ramm
  (Continued)

FOREIGN PATENT DOCUMENTS

JP    2008-113018    5/2008
JP    2009-176777    8/2009
  (Continued)

OTHER PUBLICATIONS

Official Action (with English translation) for Korean Patent Application No. 10-2010-0101764 mailed Apr. 20, 2016, 11 pages.
(Continued)

*Primary Examiner* — Lin Ye
*Assistant Examiner* — Chriss Yoder, III
(74) *Attorney, Agent, or Firm* — Sheridan Ross P.C.

(57) ABSTRACT

A semiconductor device having a first semiconductor section including a first wiring layer at one side thereof; a second semiconductor section including a second wiring layer at one side thereof, the first and second semiconductor sections being secured together with the respective first and second wiring layer sides of the first and second semiconductor sections facing each other; a conductive material extending through the first semiconductor section to the second wiring layer of the second semiconductor section and by means of which the first and second wiring layers are in electrical communication; and an opening, other than the opening for the conductive material, which extends through the first semiconductor section to the second wiring layer.

21 Claims, 29 Drawing Sheets

Related U.S. Application Data continuation of application No. 12/910,014, filed on Oct. 22, 2010, now Pat. No. 8,848,075.

(51) Int. Cl.

| | | |
|---|---|---|
| *H01L 23/48* | (2006.01) | |
| *H01L 23/00* | (2006.01) | |
| *H01L 31/02* | (2006.01) | |
| *H01L 31/0203* | (2014.01) | |
| *H01L 31/0232* | (2014.01) | |
| *H01L 31/18* | (2006.01) | |
| *H01L 21/762* | (2006.01) | |

(52) U.S. Cl.
CPC .......... *H01L 24/05* (2013.01); *H01L 27/1464* (2013.01); *H01L 27/1469* (2013.01); *H01L 27/14632* (2013.01); *H01L 27/14634* (2013.01); *H01L 27/14645* (2013.01); *H01L 27/14687* (2013.01); *H01L 31/0203* (2013.01); *H01L 31/02005* (2013.01); *H01L 31/02325* (2013.01); *H01L 31/18* (2013.01); *H01L 21/76251* (2013.01); *H01L 2224/02166* (2013.01); *H01L 2224/04042* (2013.01); *H01L 2224/45124* (2013.01); *H01L 2224/45147* (2013.01); *H01L 2224/48463* (2013.01); *H01L 2924/00014* (2013.01); *H01L 2924/01015* (2013.01); *H01L 2924/01047* (2013.01); *H01L 2924/12043* (2013.01); *H01L 2924/13091* (2013.01); *H01L 2924/14* (2013.01); *H01L 2924/3025* (2013.01)

(56) References Cited

U.S. PATENT DOCUMENTS

| | | | |
|---|---|---|---|
| 9,419,041 B2* | 8/2016 | Takahashi | H01L 21/76898 |
| 2006/0197007 A1 | 9/2006 | Iwabuchi et al. | |
| 2009/0020842 A1 | 1/2009 | Shiau et al. | |
| 2009/0185060 A1* | 7/2009 | Akiyama | H01L 27/14623 348/294 |

FOREIGN PATENT DOCUMENTS

| | | |
|---|---|---|
| KR | 10-2007-0120255 | 12/2007 |
| WO | WO 2007/148891 | 12/2007 |
| WO | WO 2008/074688 | 6/2008 |

OTHER PUBLICATIONS

Official Action (with English translation) for Chinese Patent Application No. 201410190725.1 dated Nov. 18, 2016, 20 pages.
Official Action (with English translation) for Korean Patent Application No. 10-2016-0145674 mailed Nov. 26, 2016, 9 pages.
Official Action (with English translation) for Korean Patent Application No. 10-2016-0148626 mailed Jan. 17, 2017, 14 pages.
Official Action for European Patent Application No. 10188185.2 dated Feb. 28, 2017, 8 pages.

* cited by examiner

151

21

27

82

SEMICONDUCTOR DEVICE, MANUFACTURING METHOD THEREOF, AND ELECTRONIC APPARATUS

RELATED APPLICATION DATA

This application is a continuation of U.S. patent application Ser. No. 14/451,809, filed Aug. 5, 2014, which is a continuation of U.S. patent application Ser. No. 12/910,014, filed Oct. 22, 2010, now U.S. Pat. No. 8,848,075, which claims priority to Japanese Priority Patent Application JP 2009-249327, filed in the Japan Patent Office on Oct. 29, 2009, the entire disclosures of which are hereby incorporated herein by reference.

BACKGROUND OF THE INVENTION

The present invention relates to a semiconductor device, such as a solid-state image pickup device, a manufacturing method thereof, and an electronic apparatus, such as a camera, including the solid-state image pickup device.

As a solid-state image pickup device, an amplification type solid-state image pickup device represented by an MOS, such as complementary metal oxide semiconductor (CMOS), image sensor has been used. In addition, a charge transfer type solid-state image pickup device represented by a charge coupled device (CCD) image sensor has also been used. These solid-state image pickup devices are widely used for a digital still camera, a digital video camera, and the like. In recent years, as solid-state image pickup devices mounted in mobile apparatuses, such as a camera mobile phone and a personal digital assistant (PDA), many MOS image sensors have been used in view of a low power source voltage, a low power consumption, and the like.

The MOS solid-state image pickup device includes a peripheral circuit region and a pixel array (pixel region) in which a plurality of unit pixels, each of which has a photodiode functioning as a photoelectric conversion portion and a plurality of pixel transistors, is arranged in a two-dimensional array. The pixel transistors are each formed of an MOS transistor, and the unit pixel has three transistors, that is, a transfer transistor, a reset transistor, and an amplifier transistor, or four transistors including a selection transistor besides the above three transistors.

Heretofore, as the MOS solid-state image pickup device described above, various solid-state image pickup devices have been proposed in each of which a semiconductor chip having a pixel region in which pixels are arranged and a semiconductor chip in which a logic circuit performing a signal processing is formed are electrically connected to each other to form one device. For example, in Japanese Unexamined Patent Application Publication No. 2006-49361, a semiconductor module has been disclosed in which a backside illuminated image sensor chip having micro pads in individual pixel cells and a signal processing chip which includes a signal processing circuit and micro pads are connected to each other with micro bumps interposed therebetween. In Japanese Unexamined Patent Application Publication No. 2007-13089, a device has been disclosed in which a sensor chip including an image pick-up pixel portion, which is a backside illuminated MOS solid-state image pickup element, and a signal processing chip which includes a peripheral circuit performing signal processing are mounted on an interposer (intermediate substrate). In Japanese Unexamined Patent Application Publication No. 2008-130603, the structure has been disclosed in which an image sensor chip, a thin film circuit board, and a logic circuit chip performing signal processing are provided. In addition, the structure has also been disclosed in which the logic circuit chip is electrically connected to this thin film circuit board, and the thin film circuit board is electrically connected to wire layers through a through-hole via from the rear surface of the image sensor chip.

In Japanese Patent No. 4000507, a solid-state image pickup device has been disclosed in which a solid-state image pickup element mounted on a transparent substrate is provided with a penetration electrode and is electrically connected to a flexible circuit board therethrough. Furthermore, according to Japanese Unexamined Patent Application Publication No. 2003-31785, a backside illuminated solid-state image pickup device has been disclosed in which an electrode penetrating a support substrate is provided.

As shown in Japanese Unexamined Patent Application Publication Nos. 2006-49361 and 2007-13089 and Japanese Patent No. 2008-130603, techniques in which different types of circuits, such as an image sensor chip and a logic circuit, are mounted in combination have been variously proposed. In related techniques, the features thereof are that functional chips used for this purpose are all in an almost finished making state and are formed on one chip so as to be connectable to each other by forming through substrate via holes.

As shown in the related solid-state image pickup device described above, an idea to form a semiconductor device by connecting between different types of chips with a connection conductor penetrating substrates has been proposed. However, since the connection hole has to be formed in a thick substrate while the insulation is ensured, it has been believed that the above idea is difficult to practically realize in consideration of cost economy of manufacturing processes necessary for machining the connection hole and filling a connection conductor therein.

In addition, in order to form a small contact hole having a diameter of approximately 1 μm, the thickness of an upper chip has to be ultimately reduced. In this case, before the reduction in thickness is performed, a complicated step, such as a step of adhering the upper chip to a support substrate, is necessarily performed, and hence the cost is unfavorably increased. Furthermore, in order to fill a connection conductor in a connection hole having a high aspect ratio, a CVD film, such as a tungsten (W) film, having good covering properties has to be used as the connection conductor, and hence a material for the connection conductor is limited.

In order to obtain a manufacturing process which has a superior economic efficiency and which can be easily applied to mass production, the aspect ratio of this connection hole has to be dramatically decreased for easy formation, and in addition, without using particular connection hole machining, a machining technique used in a related wafer manufacturing process is preferably selected.

In addition, in a solid-state image pickup device and the like, it has been desired that an image region and a logic circuit performing signal processing be formed to exhibit sufficient properties thereof and that the performance of the device be improved.

Besides the solid-state image pickup device, also in a semiconductor device having different types of semiconductor integrated circuits, it has been desired that the semiconductor integrated circuits be formed to exhibit sufficient properties thereof and that the performance of the semiconductor device be improved.

Furthermore, in a device in which chips are connected to each other by adhering substrates at the circuit surfaces thereof, in order to perform mounting connection, bonding pads and openings therefor necessarily formed in the vicinity of an interface of the adhesion. However, when the thickness of the substrate is large, such as approximately several hundreds of micrometers, high-cost mounting steps, such as formation of deep holes, formation of lead electrodes, and formation of solder balls, have to be performed.

In addition, since the adhesion surface has a fragile structure as compared to that of another interlayer boundary, when the boundary of the adhesion surface is present under the bonding pad, a stress generated in bonding is concentrated on a fragile portion, and as a result, cracks may be generated from the adhesion surface portion in some cases.

Furthermore, when semiconductor wafers are divided by dicing, cracks may also be generated from the adhesion surface between the substrates in some cases.

SUMMARY OF THE INVENTION

The present invention provides a semiconductor device, such as a solid-state image pickup device, which intends to improve its performance by exhibiting sufficient properties of each of semiconductor wafers laminated to each other, to improve mass productivity, and to reduce manufacturing cost, and a method for manufacturing this semiconductor device. In addition, the invention provides an electronic apparatus, such as a camera, including the above solid-state image pickup device.

One embodiment consistent with the present invention includes a semiconductor device comprising a first semiconductor section including a first wiring layer at one side thereof, a second semiconductor section including a second wiring layer at one side thereof, the first and second semiconductor sections being secured together with the respective first and second wiring layer sides of the first and second semiconductor sections facing each other, a conductive material extending through the first semiconductor section to the second wiring layer of the second semiconductor section and by means of which the first and second wiring layers are in electrical communication, and an opening, other than the opening for the conductive material, through the first semiconductor section to the second wiring layer.

Another embodiment consistent with the present invention includes a semiconductor substrate comprising an adhesive layer between the first semiconductor section and the second semiconductor section that secures the first semiconductor section and second semiconductor section together.

Another embodiment consistent with the present invention includes a semiconductor substrate where the second wiring layer includes an aluminum wire in contact with said conductive material.

Another embodiment consistent with the present invention includes a semiconductor substrate where the first wiring layer includes a copper wire and the conductive material is in contact with the copper wire.

Another embodiment consistent with the present invention includes a semiconductor substrate comprising a stress reduction film between the first semiconductor section and the second semiconductor section.

Another embodiment consistent with the present invention includes a semiconductor substrate comprising a photodiode in the first semiconductor section on a side of the first semiconductor section opposite the first multilayer wiring layer.

Another embodiment consistent with the present invention includes a semiconductor substrate comprising a suppression layer over the photodiode.

Another embodiment consistent with the present invention includes a semiconductor substrate comprising an anti-reflection film over the suppression layer.

Another embodiment consistent with the present invention includes a semiconductor substrate where the first semiconductor section and second semiconductor section are secured together by plasma bonding.

Another embodiment consistent with the present invention includes a method of manufacturing a semiconductor device including the steps of forming a first semiconductor section including a first wiring layer at one side thereof, forming a second semiconductor section including a second wiring layer at one side thereof, securing the first semiconductor section to the second semiconductor section with the respective first and second wiring layer sides of the first and second semiconductor sections facing each other, providing a conductive material extending through the first semiconductor section to the second wiring layer of the second semiconductor section by means of which the first and second wiring layers can be in electrical communication; and forming an opening, other than the opening for the conductive material, through the first semiconductor section which exposes the second wiring layer.

Another embodiment consistent with the present invention includes a method of manufacturing a semiconductor device where the first semiconductor section and the second semiconductor section are secured together by means of adhesion.

Another embodiment consistent with the present invention includes a method of manufacturing a semiconductor device where the second wiring layer includes an aluminum wire.

Another embodiment consistent with the present invention includes a method of manufacturing a semiconductor device where the conductive material is in contact with the aluminum wire.

Another embodiment consistent with the present invention includes a method of manufacturing a semiconductor device where the first wiring layer includes a copper wire and the conductive material is in contact with the copper wire.

Another embodiment consistent with the present invention includes a method of manufacturing a semiconductor device including the step of providing a stress reduction between the first semiconductor section and the second semiconductor section.

Another embodiment consistent with the present invention includes a method of manufacturing a semiconductor device including the step of forming a photodiode in the first semiconductor section on a side of the first semiconductor section opposite the first multilayer wiring layer.

16 Another embodiment consistent with the present invention includes a method of manufacturing a semiconductor device including the step of etching the side of the first semiconductor section furthest from the second semiconductor section such that a thin layer remains over the photodiode.

Another embodiment consistent with the present invention includes a method of manufacturing a semiconductor device including the step of forming an anti-reflection film over the photodiode.

Another embodiment consistent with the present invention includes a method of manufacturing a semiconductor device where the first semiconductor section and second semiconductor section are secured together by plasma bonding.

Another embodiment consistent with the present invention includes a semiconductor device comprising a first semiconductor section including a first wiring layer on one side and a device layer on the opposite side thereof, a second semiconductor section including a second wiring layer at one side thereof, the first and second semiconductor sections being secured together with the respective first and second wiring layer sides of the first and second semiconductor sections facing each other, a first conductive material which extends through the device layer of the first semiconductor section to a connection point in the first wiring layer of the first semiconductor section, and a second conductive material which extends through the first semiconductor section to a connection point in the second wiring layer of the second semiconductor section such that the first and second wiring layers are in electrical communication, and an opening, other than the openings for the first and second conductive materials, extending through the first semiconductor section which exposes the second wiring layer.

Another embodiment consistent with the present invention includes a semiconductor device comprising the adhesive between the first semiconductor section that bonds the first semiconductor section and second semiconductor section.

Another embodiment consistent with the present invention includes a semiconductor device where the second wiring layer includes an aluminum wire.

Another embodiment consistent with the present invention includes a semiconductor device where the first conductive material and the second conductive material electrically connect the aluminum wire in the second wiring layer to a copper wire in the first wiring layer.

Another embodiment consistent with the present invention includes a semiconductor device comprising a stress reduction film between the first semiconductor section and the second semiconductor section.

Another embodiment consistent with the present invention includes a semiconductor device comprising a photodiode in the first semiconductor section on a side of the first semiconductor section opposite the first multilayer wiring layer.

Another embodiment consistent with the present invention includes a semiconductor device comprising a suppression layer over the photodiode.

Another embodiment consistent with the present invention includes a semiconductor device comprising an anti-reflection film over the photodiode.

Another embodiment consistent with the present invention includes a semiconductor device where the first semiconductor section and second semiconductor section are secured together by a plasma bond.

Another embodiment consistent with the present invention includes a method of manufacturing a semiconductor device including the steps of forming a first semiconductor section including a first wiring layer on one side and a device layer on the opposite side of the first wiring layer, forming a second semiconductor section including a second wiring layer at one side thereof, bonding the first semiconductor section to the second semiconductor section with the respective first and second wiring layer sides of the first and second semiconductor sections facing each other, providing a first conductive material which extends through the device layer of the first semiconductor section to a connection point in the first wiring layer of the first semiconductor section, providing a second conductive material which extends in parallel to the first conductive material and which extends through the first semiconductor section to a connection point in the second wiring layer of the second semiconductor section such that the first and second wiring layers are in electrical communication, and forming an opening, other than the openings for the first and second conductive materials, extending through the first semiconductor section which exposes the second wiring layer.

Another embodiment consistent with the present invention includes a method of manufacturing a semiconductor device including the step of providing an adhesive layer between the first semiconductor and the second semiconductor section.

Another embodiment consistent with the present invention includes a method of manufacturing a semiconductor device where the second wiring layer includes an aluminum wire.

Another embodiment consistent with the present invention includes a method of manufacturing a semiconductor device where the first conductive material and second conductive material electrically connect the aluminum wire in the second wiring layer to a copper wire in the first wiring layer.

Another embodiment consistent with the present invention includes a method of manufacturing a semiconductor device including the step of providing a stress reduction film between the first semiconductor section and the second semiconductor section.

Another embodiment consistent with the present invention includes a method of manufacturing a semiconductor device including the step of forming a photodiode in the first semiconductor section on a side of the first semiconductor section opposite the first multilayer wiring layer.

Another embodiment consistent with the present invention includes a method of manufacturing a semiconductor device including the step of etching the side of the first semiconductor section opposite the multilayer wiring layer such that a thin layer remains over the photodiode.

Another embodiment consistent with the present invention includes a method of manufacturing a semiconductor device including the step of providing an anti-reflection film over the photodiode.

Another embodiment consistent with the present invention includes a method of manufacturing a semiconductor device where the first semiconductor section and second semiconductor section are secured together by a plasma bond.

Another embodiment consistent with the present invention includes a semiconductor device including an optical unit, and an imaging unit including (a) a first semiconductor section including a first wiring layer and a device layer on the first wiring layer, (b) a second semiconductor section including a second wiring layer at one side thereof, the first and second semiconductor sections being secured together with the respective first and second wiring layer sides of the first and second semiconductor sections facing each other, (c) a first conductive material which extends through the device layer of the first semiconductor section to a connection point in the first wiring layer of the first semiconductor section, (d) a second conductive material which extends through the first semiconductor section to a connection point in the second wiring layer of the second semiconductor section such that the first and second wiring layers are in electrical communication, and (e) an opening, other than the openings for the first and second conductive materials, through the first semiconductor section which exposes the second wiring layer.

Another embodiment consistent with the present invention includes a method of manufacturing a semiconductor device comprising a shutter unit between the optical unit and the imaging unit.

Another embodiment consistent with the present invention includes a method of manufacturing a semiconductor device including an optical unit and an imaging unit including (a) a first semiconductor section including a first wiring layer on one side and a device layer on the opposite side thereof, (b) a second semiconductor section including a second wiring layer at one side thereof, the first and second semiconductor sections secured together with the respective first and second wiring layer sides of the first and second semiconductor sections facing each other, (c) a first conductive material which extends through the device layer of the first semiconductor section to a connection point in the first wiring layer of the first semiconductor section, and (d) a second conductive material which extends through the first semiconductor section to a connection point in the second wiring layer of the second semiconductor section such that the first and second wiring layers are in electrical communication, (e) an opening, other than the openings for the first and second conductive materials, through the first semiconductor section which exposes the second wiring layer.

Another embodiment consistent with the present invention includes a method of manufacturing a semiconductor device including a shutter unit between the optical unit and the imaging unit.

According to the present invention, by using optimal process techniques, semiconductor wafers each having a circuit which exhibits sufficient properties thereof can be laminated to each other; hence a semiconductor device which has superior mass productivity and high performance can be obtained at a low cost. In addition, when the semiconductor device is applied to a backside illuminated solid-state image pickup device, and this solid-state image pickup device is used in an electronic apparatus, a high performance electronic apparatus can be obtained.

DESCRIPTION OF THE PRESENTLY PREFERRED EMBODIMENTS

Figure 1:
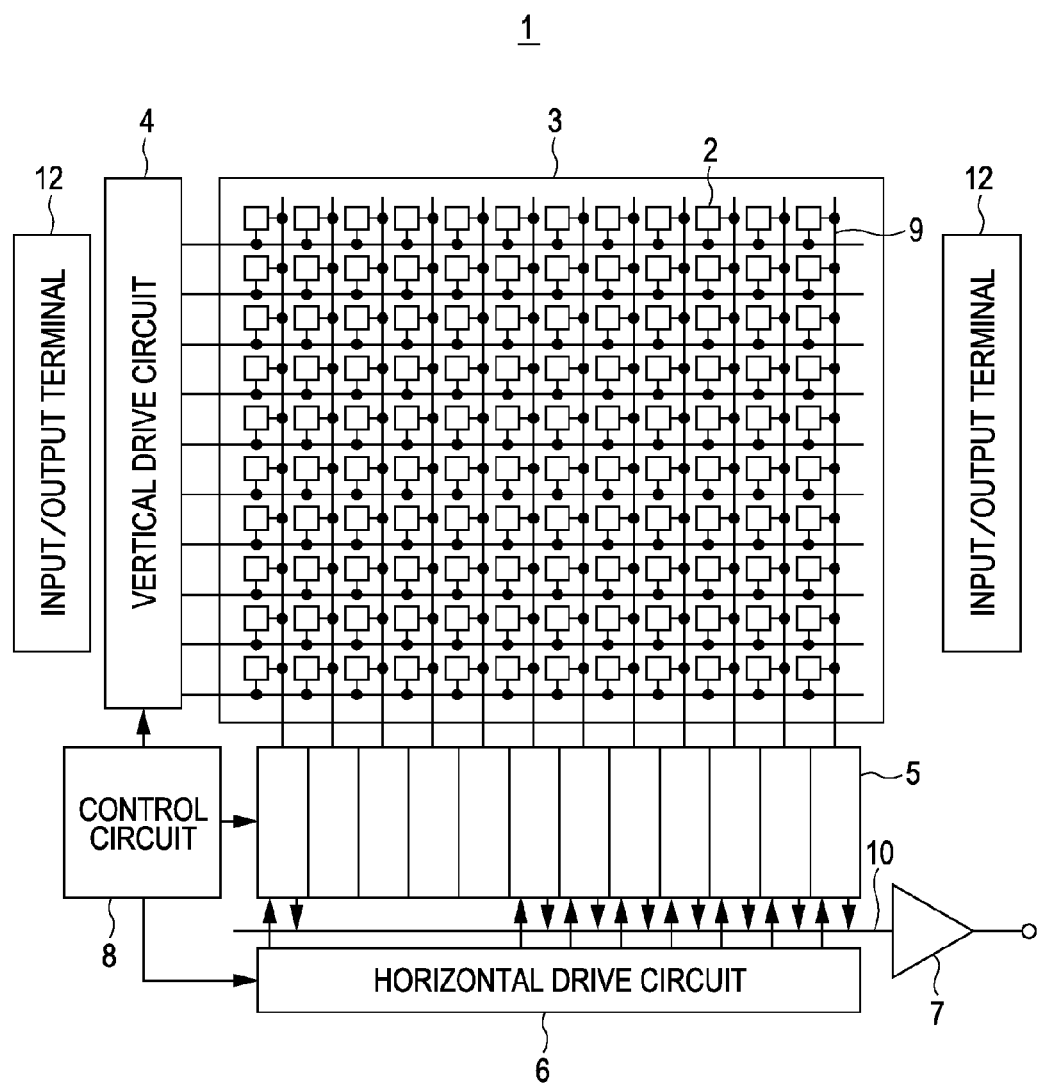
FIG. 1 is a schematic structural view showing one embodiment of an MOS solid-state image pickup device consistent with the present invention.

FIG. 1 shows a schematic structure of an MOS solid-state image pickup device applied to a semiconductor device according to an embodiment of the present invention. This MOS solid-state image pickup device is applied to a solid-state image pickup device of each embodiment. A solid-state image pickup device 1 of this example includes a pixel region (so-called pixel array) 3 in which pixels 2 each including a photoelectric conversion portion are regularly arranged in a two-dimensional array and a peripheral circuit portion on a semiconductor substrate (not shown) such as a silicon substrate. The pixel 2 has, for example, a photodiode functioning as a photoelectric conversion portion and a plurality of pixel transistors (so-called MOS transistors). The plurality of pixel transistors may include three transistors, such as a transfer transistor, a reset transistor, and an amplifier transistor. Alternatively, the plurality of pixel transistor may include four transistors by adding a selection transistor to the above three transistor. Since the equivalent circuit of the unit pixel is the same as that of a general pixel, a detailed description is omitted. The pixel 2 may be formed as one unit pixel. In addition, the pixel 2 may have a shared pixel structure. This shared pixel structure is a structure in which a plurality of photodiodes share a floating diffusion forming a transfer transistor and transistors other than the transfer transistor.

The peripheral circuit portion includes a vertical drive circuit 4, column signal processing circuits 5, a horizontal drive circuit 6, an output circuit 7, a control circuit 8, and the like.

The control circuit 8 receives an input clock and a data instructing an operation mode or the like and outputs a data such as internal information of the solid-state image pickup device. That is, based on a vertical synchronous signal, a horizontal synchronous signal, and a master clock, the control circuit 8 generates a clock signal and a control signal which are used as the base of the operations of the vertical drive circuit 4, the column signal processing circuits 5, the horizontal drive circuit 6, and the like. In addition, these signals are input into the vertical drive circuit 4, the column signal processing circuits 5, the horizontal drive circuit 6, and the like.

The vertical drive circuit 4 includes a shift register or the like, selects a pixel drive line, supplies a pulse thereto to drive pixels, and drives pixels on a row basis. That is, the vertical drive circuit 4 sequentially performs selective scanning of pixels 2 on a row basis of the pixel region 3 in the vertical direction and supplies pixel signals based on signal charges generated in accordance with the amount of light received in the photoelectric conversion portion, such as a photodiode, of each pixel 2 to the column signal processing circuits 5 through vertical signal lines 9.

The column signal processing circuits 5 are each disposed, for example, for each line of the pixels 2 and each perform signal processing, such as noise removal, on signals output from the pixels 2 on a line basis for each pixel line. That is, the column signal processing circuit 5 performs signal processing, such as correlated double sampling (CDS) which removes fixed pattern noise inherent in the pixel 2, signal amplification, and analog-to-digital (AD) conversion. An output stage of the column signal processing circuit 5 is connected to a horizontal signal line 10 with a horizontal selection switch (not shown) interposed therebetween.

The horizontal drive circuit 6 includes a shift register or the like, sequentially selects the column signal processing circuits 5 by sequentially outputting horizontal scanning pulses, so that the respective column signal processing circuits 5 are allowed to output pixel signals to the horizontal signal line 10.

The output circuit 7 performs signal processing on signals sequentially supplied from the respective column signal processing circuits 5 through the horizontal signal line 10 and outputs the signals thus processed. For example, only buffering may be performed in some cases, or a black level adjustment, a line variation correction, and various digital signal processing may be performed in some cases. Input/output terminals 12 send and receive signals to and from the outside.

Figure 2A:
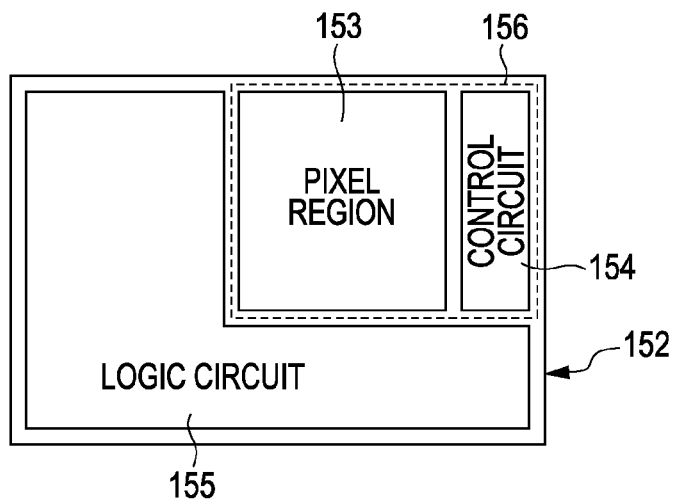
FIG. 2A is a schematic view of a related solid-state image pickup device consistent with the present invention.

Next, the structure of the MOS solid-state image pickup device according to this embodiment will be described. FIG. 2A is a schematic view showing the structure of a related MOS solid-state image pickup device, and FIGS. 2B and 2C are schematic views each showing the structure of the MOS solid-state image pickup device according to this embodiment.

As shown in FIG. 2A, a related MOS solid-state image pickup device 151 includes in one semiconductor chip 152, a pixel region 153, a control circuit 154, and a logic circuit 155 performing signal processing. In general, the pixel region 153 and the control circuit 154 form an image sensor 156.

Figure 2B:
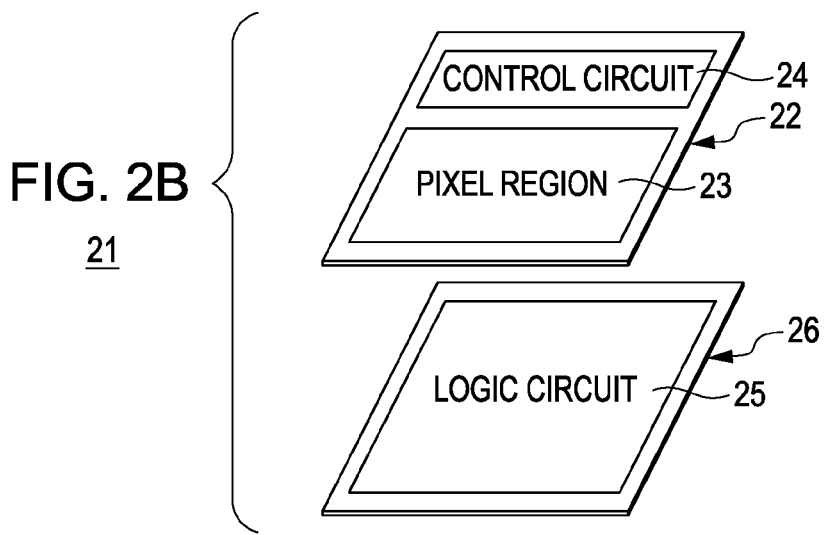
FIGS. 2B and 2C are each a schematic view of a solid-state image pickup device consistent with the present invention.

On the other hand, as shown in FIG. 2B, in an MOS solid-state image pickup device 21 of this embodiment example, a pixel region 23 and a control circuit 24 are mounted on a first semiconductor chip portion 22, and a logic circuit 25 including a signal processing circuit which performs signal processing is mounted on a second semiconductor chip portion 26. This first semiconductor chip portion 22 and the second semiconductor chip portion 26 are electrically connected to each other to form the MOS solid-state image pickup device 21 as one semiconductor chip.

Figure 2C:
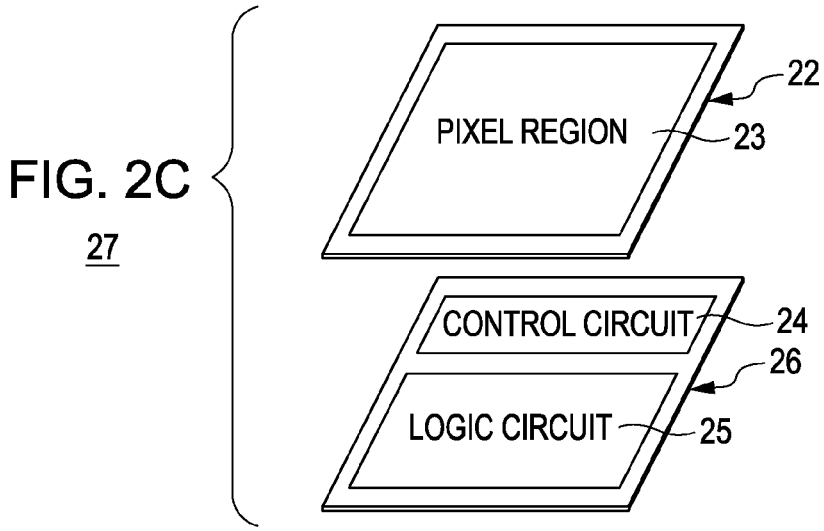

As shown in FIG. 2C, in an MOS solid-state image pickup device 27 of another embodiment example of the present invention, a pixel region 23 is mounted on a first semiconductor chip portion 22, and a control circuit 24 and a logic circuit 25 including a signal processing circuit are mounted on a second semiconductor chip portion 26. This first semiconductor chip portion 22 and the second semiconductor chip portion 26 are electrically connected to each other to form the MOS solid-state image pickup device 27 as one semiconductor chip.

The MOS solid-state image pickup devices of the above embodiment examples each have the structure in which different types of semiconductor chips are laminated to each other, and as described later, a manufacturing method of the above solid-state image pickup device and the structure obtained thereby have advantages.

In the following embodiment examples, a solid-state image pickup device according to an embodiment of the present invention and a manufacturing method thereof will be described.

With reference to FIG. 3 and FIGS. 4 to 20, as a semiconductor device according to a first embodiment example of the present invention, a backside illuminated MOS solid-state image pickup device will be described together with a manufacturing method thereof.

Figure 3:
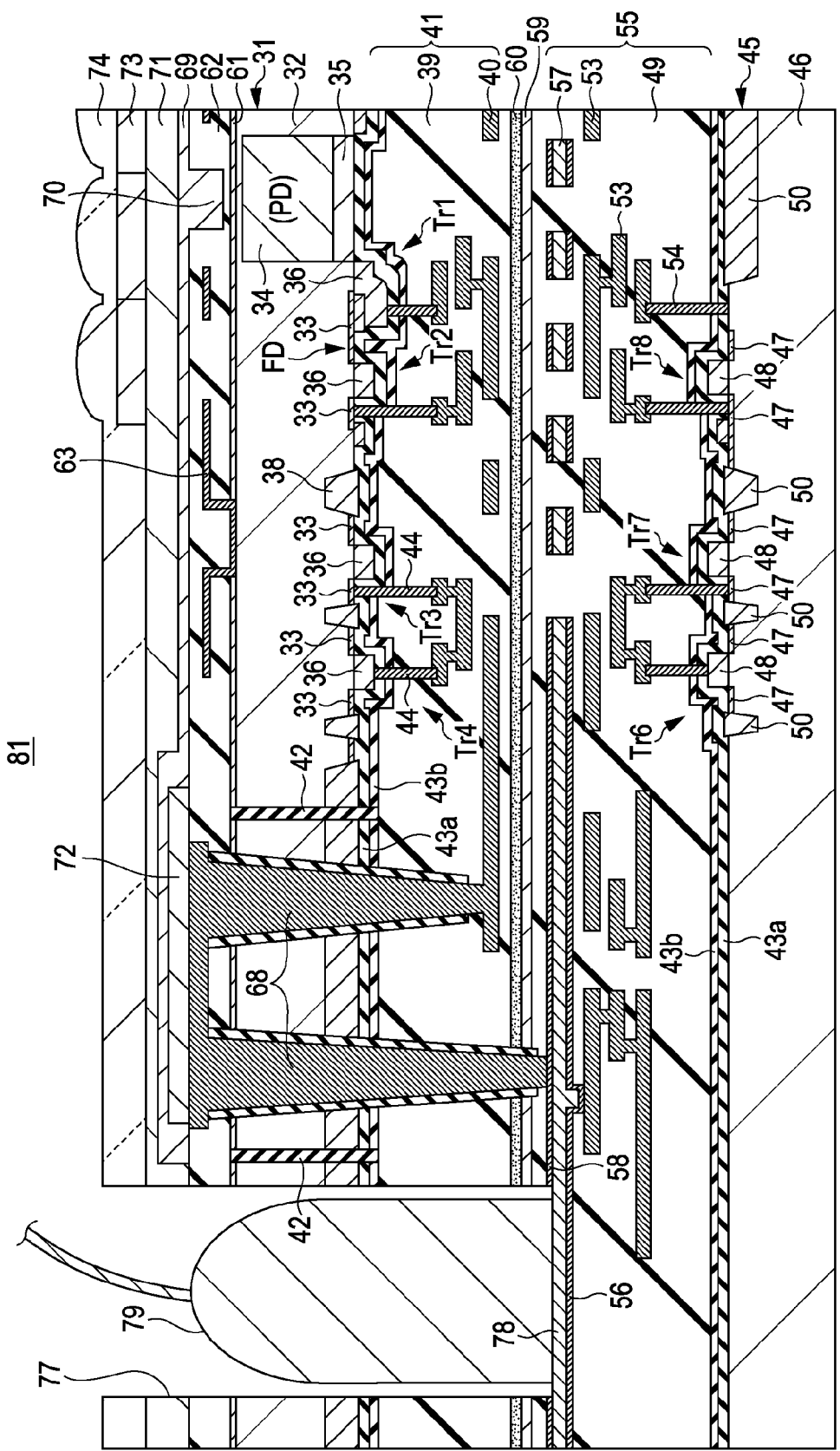
FIG. 3 is a schematic structural view showing a portion of a solid-state image pickup device consistent with the present invention.

FIG. 3 is a schematic cross-sectional structural view (completed view) including an electrode pad portion 78 of a solid-state image pickup device of this embodiment example. In a solid-state image pickup device 81 of this embodiment example, a first semiconductor chip portion 22 including a pixel array (hereinafter referred to as "pixel region") 23 and a control circuit 24 and a second semiconductor chip portion 26 on which a logic circuit 25 is mounted are laminated in a vertical direction so as to be electrically connected to each other.

With reference to FIGS. 4 to 19, a method for manufacturing the solid-state image pickup device 81 of this embodiment example will be described.

Figure 4:
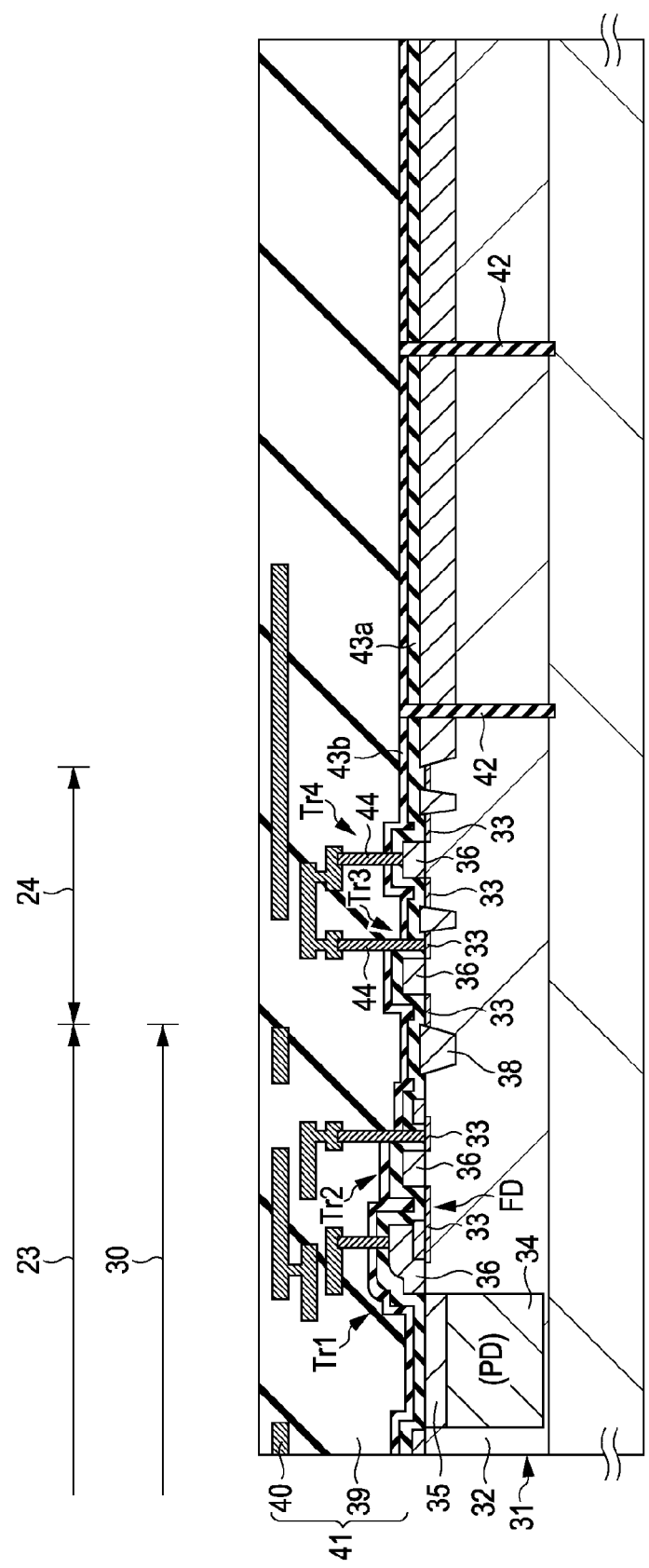
FIG. 4 shows a method for manufacturing the solid-state image pickup device that is consistent with the present invention.

In the first embodiment example, as shown in FIG. 4, first, a semi-finished image sensor, that is, a semi-finished pixel region 23 and a semi-finished control circuit 24, is formed on a region of a first semiconductor wafer (hereinafter referred to as "first semiconductor substrate") 31 which is to be formed into each chip portion. That is, on the region of the first semiconductor substrate 31 formed of a silicon substrate on which each chip portion is formed, a photodiode (PD) functioning as a photoelectric conversion portion of each pixel is formed, and source/drain regions 33 for each pixel transistor are formed in a semiconductor well region 32. The semiconductor well region 32 is formed by implanting a first conductive impurity, such as a p-type impurity, and the source/drain regions 33 are formed by implanting a second conductive impurity, such as an n-type impurity. The photodiode (PD) and the source/drain regions 33 of each pixel transistor are formed by ion implantation performed from the substrate surface.

The photodiode (PD) is formed of an n-type semiconductor region 34 and a p-type semiconductor region 35 located at a substrate surface side. Gate electrodes 36 are formed on a substrate surface on which pixels are formed with a gate insulating film interposed therebetween to form pixel transistors Tr1 and Tr2 with the source/drain regions 33. In FIG. 4, a plurality of pixel transistors is represented by the two pixel transistors Tr1 and Tr2. The pixel transistor Tr1 adjacent to the photodiode (PD) corresponds to a transfer transistor and one of the source/drain regions thereof corresponds to a floating diffusion (FD). Unit pixels 30 are separated from each other by an element isolation region 38.

In addition, at a control circuit 24 side, MOS transistors forming a control circuit are formed on the first semiconductor substrate 31. In FIG. 3, the MOS transistors forming the control circuit 24 are represented by MOS transistors Tr3 and Tr4. The MOS transistors Tr3 and Tr4 each include n-type source/drain regions 33 and a gate electrode 36 formed on a gate insulating film.

Next, after a first-layer interlayer insulating film 39 is formed on the surface of the first semiconductor substrate 31, connection holes are formed in the interlayer insulating film 39, and connection conductors 44 connected to necessary transistors are formed. When connection conductors having different heights are formed, a first insulating thin film 43a, such as a silicon oxide film, is formed on the entire surface including upper surfaces of the transistors, and a second insulating thin film 43b, such as silicon nitride film, functioning as an etching stopper is laminated on the first insulating thin film 43a. The first-layer interlayer insulating film 39 is formed on this second insulating thin film 43b. In order to form the first-layer interlayer insulating film 39, for example, after a plasma oxide film (P-SiO film) is formed to have a thickness of 10 to 150 nm, a non-doped silicate glass (NSG) film or a phosphosilicate glass (PSG) film is formed to have a thickness of 50 to 1,000 nm. Subsequently, a dTEOS film having a thickness of 100 to 1,000 nm is formed, and a plasma oxide film (P-SiO film) is formed to have a thickness of 50 to 200 nm, so that the first-layer interlayer insulating film 39 is formed.

Subsequently, connection holes having different depths are selectively formed in the first-layer interlayer insulating film 39 to the second insulating thin film 43b functioning as an etching stopper. Next, the first insulating thin film 43a and the second insulating thin film 43b, each of which have a uniform thickness at the respective portions, are selectively etched to form connection holes so as to communicate with the connection holes described above. Subsequently, the connection conductors 44 are filled in the respective connection holes.

In addition, after the second insulating thin film 43b is formed, an insulating spacer layer 42 isolating a desired region in the semiconductor well region 32 of the first semiconductor substrate 31 is formed. The insulating spacer layer 42 is formed in such a way that after the second insulating thin film 43b is formed, an opening is formed at a desired position of the first semiconductor substrate 31 from the rear surface side thereof, and an insulating material is then filled in the opening. This insulating spacer layer 42 is formed in a region surrounding an inter-substrate wire 68 shown in FIG. 3.

Next, a plurality of layers, that is, three layers of copper wires 40 in this example, are formed to be connected to the connection conductors 44 with the interlayer insulating films 39 interposed therebetween, so that a multilayer wire layer 41 is formed. In general, each copper wire 40 is covered with a barrier metal layer (not shown) to prevent Cu diffusion. The barrier metal layer may be formed of a SiN film or a Sic film having a thickness of 10 to 150 nm. In addition, for a second-layer interlayer insulating film 39 and so forth, a dTEOS film (silicon oxide film formed by a plasma CVD method) having a thickness of 100 to 1,000 nm may be used. When the interlayer insulating films 39 and the copper wires 40 are alternately formed with the barrier metal layers interposed therebetween, the multilayer wire layer 41 is formed. In this embodiment example, although the multilayer wire layer 41 is formed using the copper wires 40 by way of example, another metal material may also be used as a metal wire.

By the steps described above, the semi-finished pixel region 23 and the semi-finished control circuit 24 are formed on the first semiconductor substrate 31.

Figure 5:
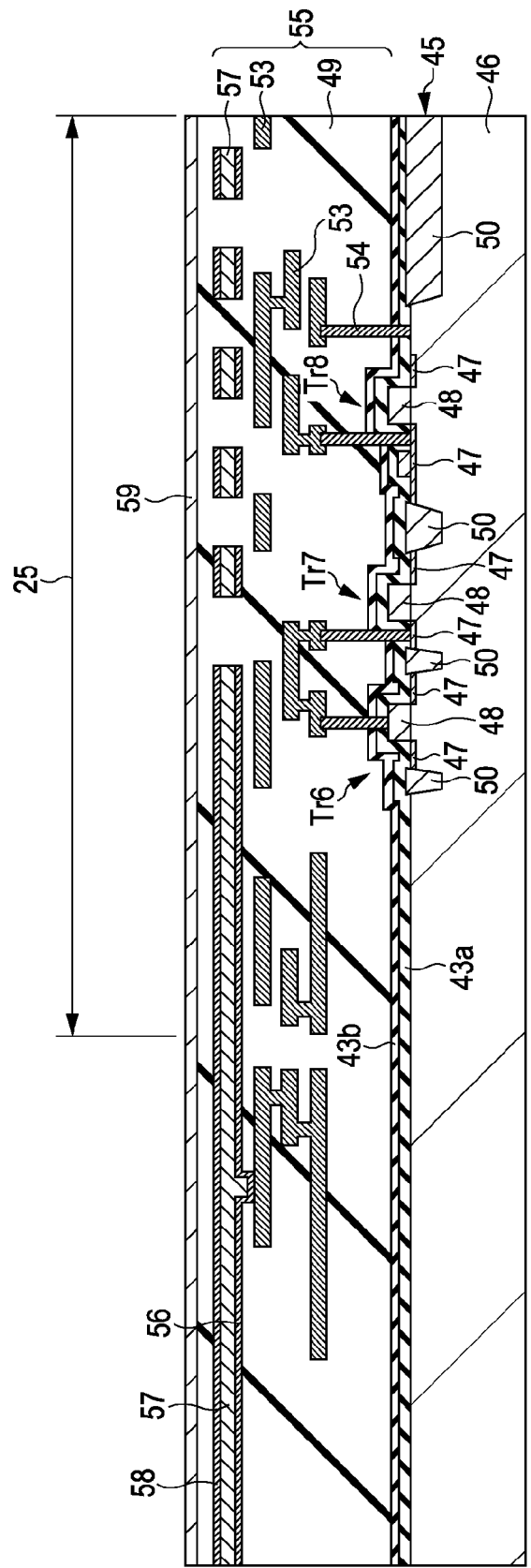
FIG. 5 shows a method for manufacturing the solid-state image pickup device that is consistent with the present invention.

In addition, as shown in FIG. 5, on a region of a second semiconductor substrate (semiconductor wafer) 45 formed of, for example, of silicon which is to be formed into each chip portion, a semi-finished logic circuit 25 including a signal processing circuit for signal processing is formed. That is, on a p-type semiconductor well region 46 of the second semiconductor substrate 45 located at a surface side, a plurality of MOS transistors forming the logic circuit 25 is formed so as to be isolated from each other by an element isolation region 50. In this case, the plurality of MOS transistors is represented by MOS transistors Tr6, Tr7, and Tr8. The MOS transistors Tr6, Tr7, and Tr8 are each formed of n-type source/drain regions 47 and a gate electrode 48 provided on a gate insulating film. The logic circuit 25 may be formed of CMOS transistors.

Next, after a first-layer interlayer insulating film 49 is formed on the surface of the second semiconductor substrate 45, connection holes are formed in the interlayer insulating film 49, and connection conductors 54 to be connected to necessary transistors are formed. When connection conductors 54 having different heights are formed, as described above, a first insulating thin film 43a, such as a silicon oxide film, and a second insulating thin film 43b, such as a silicon nitride film, functioning as an etching stopper are laminated on the entire surface including upper surfaces of the transistors. The first-layer interlayer insulating film 49 is formed on this second insulating thin film 43b. In addition, connection holes having different depths are selectively formed in the first-layer interlayer insulating film 49 to the second insulating thin film 43b functioning as an etching stopper. Next, the first insulating thin film 43a and the second insulating thin film 43b, each of which have a uniform thickness at the respective portions, are selectively etched to form connection holes so as to communicate with the connection holes described above. Subsequently, the connection conductors 54 are filled in the respective connection holes.

Next, the formation of the interlayer insulating film 49 and the formation of a metal wire layer are repeatedly performed, so that a multilayer wire layer 55 is formed. In this embodiment, after three layers of copper wires 53 are formed in a manner similar to that of the formation step of the multilayer wire layer 41 on the first semiconductor substrate 31, an aluminum wire 57 is formed as the topmost layer. The aluminum wire 57 is formed such that after the interlayer insulating film 49 is formed on the topmost layer of the copper wire 53, the interlayer insulating film 49 is etched so that desired positions of the upper portion of the topmost layer of the copper wire 53 are exposed, thereby forming connection holes. Subsequently, on a region including the insides of the connection holes, there is formed a multilayer film of TiN (lower layer)/Ti (upper layer) functioning as a barrier metal layer 56 having a thickness of 5 to 10 nm or a multilayer film of TaN (lower layer)/Ta (upper layer) having a thickness of 10 to 100 nm. Next, an aluminum film having a thickness of 500 to 2,000 nm is formed to cover the connection holes and is then patterned into a desired shape, thereby forming the aluminum wire 57. Furthermore, a barrier metal layer 58 which is necessary in a subsequent step is formed on the aluminum wire 57. This barrier metal layer 58 may have a composition similar to that of the barrier metal layer 56 which is formed under the aluminum wire 57.

In addition, the interlayer insulating film 49 is formed to cover the aluminum wire 57 together with the barrier metal layer 58 provided thereon. The interlayer insulating film 49 on the aluminum wire 57 may be formed such that, for example, after a high density plasma oxide film (HDP film) or a plasma oxide film (P-SiO film) is formed to have a thickness of 500 to 2,000 nm, a p-SiO film having a thickness of 100 to 2,000 nm is further formed on the film described above. As a result, the multilayer wire layer 55 is formed which includes the three layers of the copper wires 53 and the aluminum wire 57 formed as the topmost layer with the interlayer insulating films 49 interposed therebetween.

In addition, on the multilayer wire layer 55, a stress correction film 59 is formed which reduces a stress generated when the first semiconductor substrate 31 and the second semiconductor substrate 45 are adhered to each other. The stress correction film 59 may be formed, for example, from a P—SiN film or a plasma oxynitride film (P-SiON film) having a thickness of 100 to 2,000 nm.

By the steps described above, the semi-finished logic circuit 25 is formed on the second semiconductor substrate 45.

Figure 6:
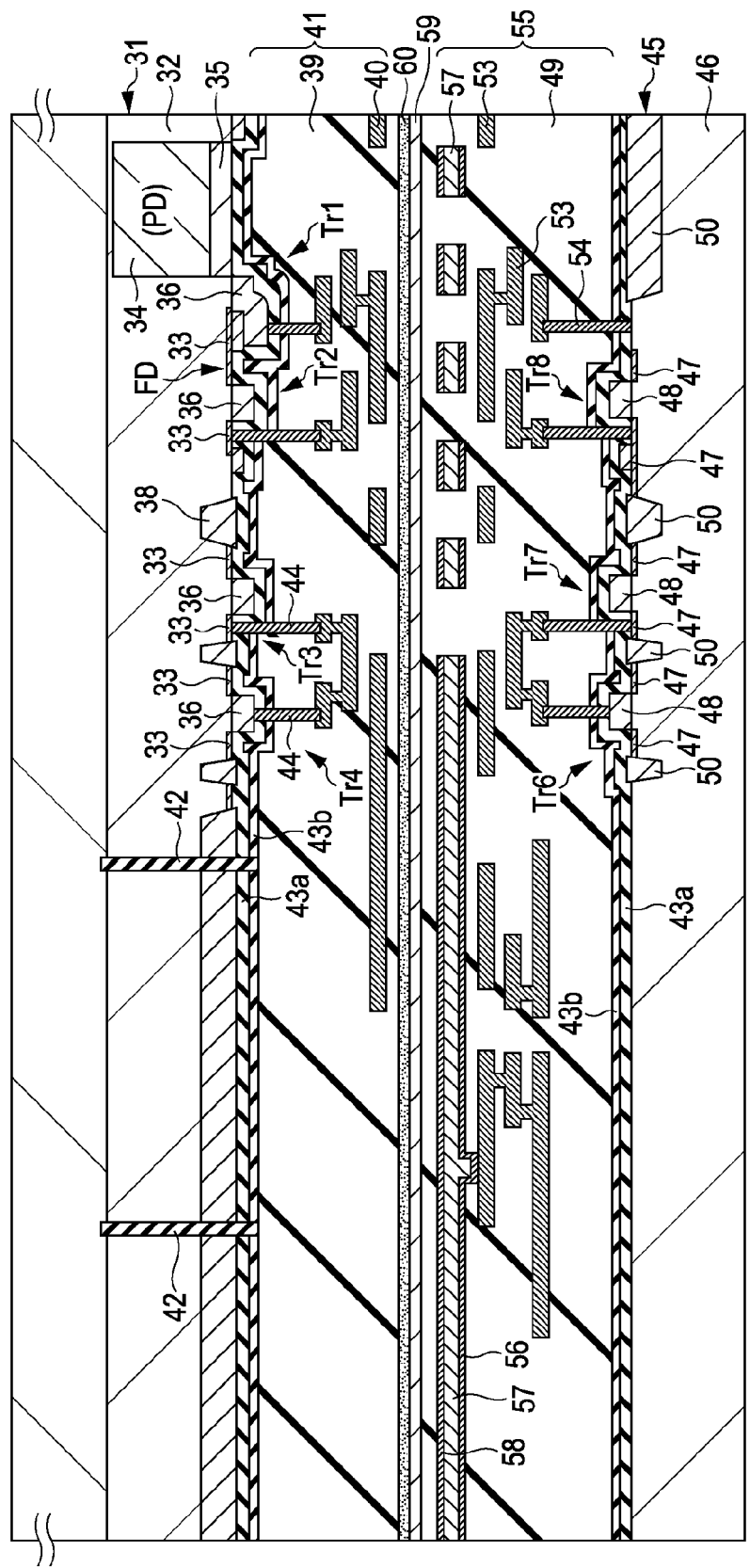
FIG. 6 shows a method for manufacturing the solid-state image pickup device that is consistent with the present invention.

Next, as shown in FIG. 6, the first semiconductor substrate 31 and the second semiconductor substrate 45 are secured to each other so that the multilayer wire layer 41 faces the multilayer wire layer 55. The adhesion is performed using an adhesive. When the adhesion is performed using an adhesive, an adhesive layer 60 is formed on one bonding surface of the first semiconductor substrate 31 or the second semiconductor substrate 45, and with this adhesion layer 60, the two substrates are overlapped with and secured to each other. In this embodiment, after the first semiconductor substrate 31 on which the pixel region is formed is disposed at an upper layer side, and the second semiconductor substrate 45 is disposed at a lower layer side, the adhesion is performed therebetween.

In addition, in this embodiment, the first semiconductor substrate 31 and the second semiconductor substrate 45 are adhered to each other with the adhesive layer 60 interposed therebetween is described by way of example; however, adhesion may also be performed by plasma bonding. In the case of the plasma bonding, a plasma TEOS film, a plasma SiN film, a SiON film (block film), a SiC film, or the like is formed on a bonding surface of each side of the first semiconductor substrate 31 and the second semiconductor substrate 45. The bonding surfaces each provided with one of the above films are processed by a plasma treatment and are overlapped with each other, and subsequently, the two semiconductor substrates are secured to each other by an annealing treatment. The adhesion treatment is preferably performed by a low temperature process at a temperature of 400° C. or less in which wires and the like are not adversely influenced.

In addition, the first semiconductor substrate 31 and the second semiconductor substrate 45 are laminated and adhered to each other, so that a laminate 81a including the two different types of substrates is formed.

Figure 7:
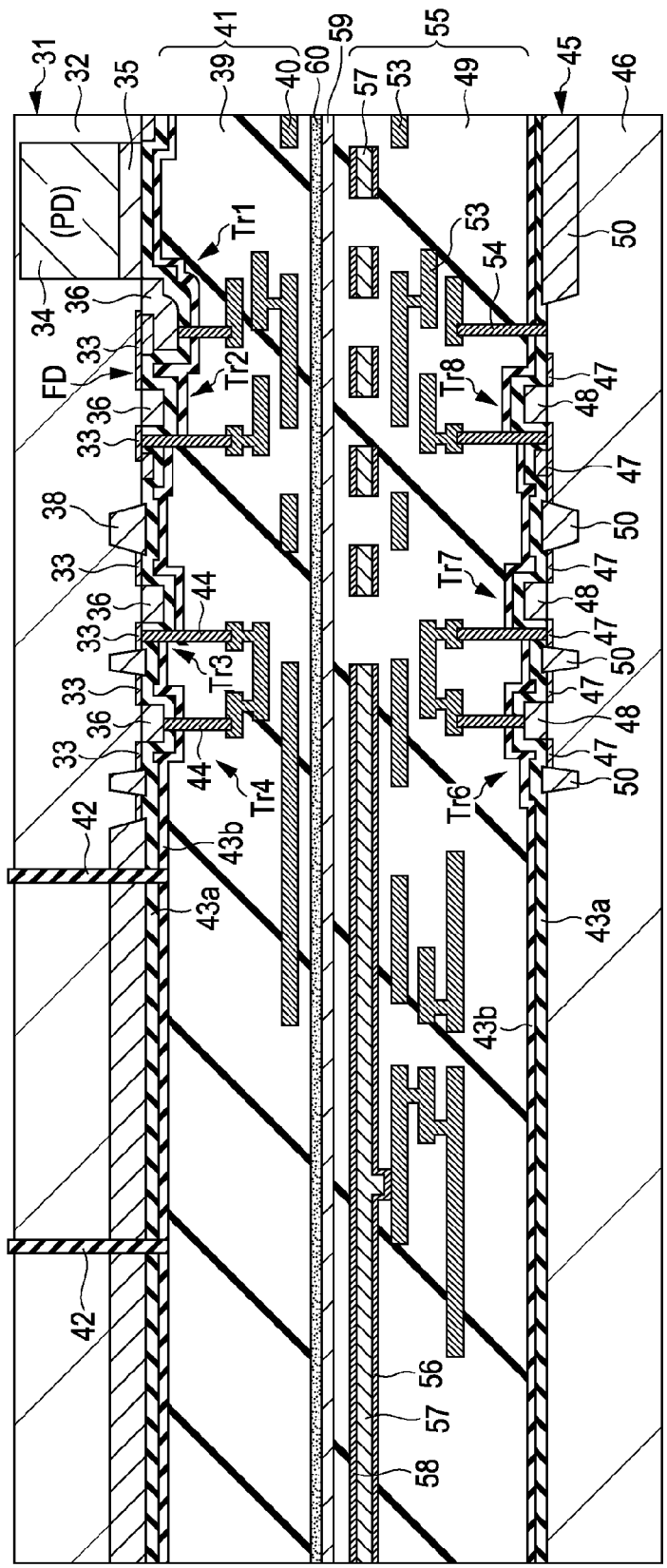
FIG. 7 shows a method for manufacturing the solid-state image pickup device that is consistent with the present invention.

Next, as shown in FIG. 7, grinding and polishing are performed from a rear surface 31b side of the first semiconductor substrate 31 to reduce the thickness thereof. The thickness is reduced so that a thin layer is provided on the photodiode (PD). As the first semiconductor substrate 31 when a semiconductor substrate in which a heavily doped p-type impurity layer is formed as an etching stopper layer (not shown) is used, by etching the substrate to the etching stopper layer, the thickness of the semiconductor substrate can be uniformly reduced. After the thickness reduction is performed, a p-type semiconductor layer is formed on the rear surface of the photodiode (PD) to suppress a dark current. Although the thickness of the first semiconductor substrate 31 is approximately 600 μm, the thickness thereof is reduced to approximately 3 to 5 μm. Heretofore, the thickness reduction described above has been performed after a support substrate which is separately prepared is adhered to the multilayer wire layer 41 on the first semiconductor substrate 31. However, in this embodiment, the thickness reduction of the first semiconductor substrate 31 is performed by also using the second semiconductor substrate 45 on which the logic circuit 25 is formed as a support substrate. The rear surface 31b of this first semiconductor substrate 31 functions as a light incident surface when a backside illuminated solid-state image pickup device is formed.

Figure 8:
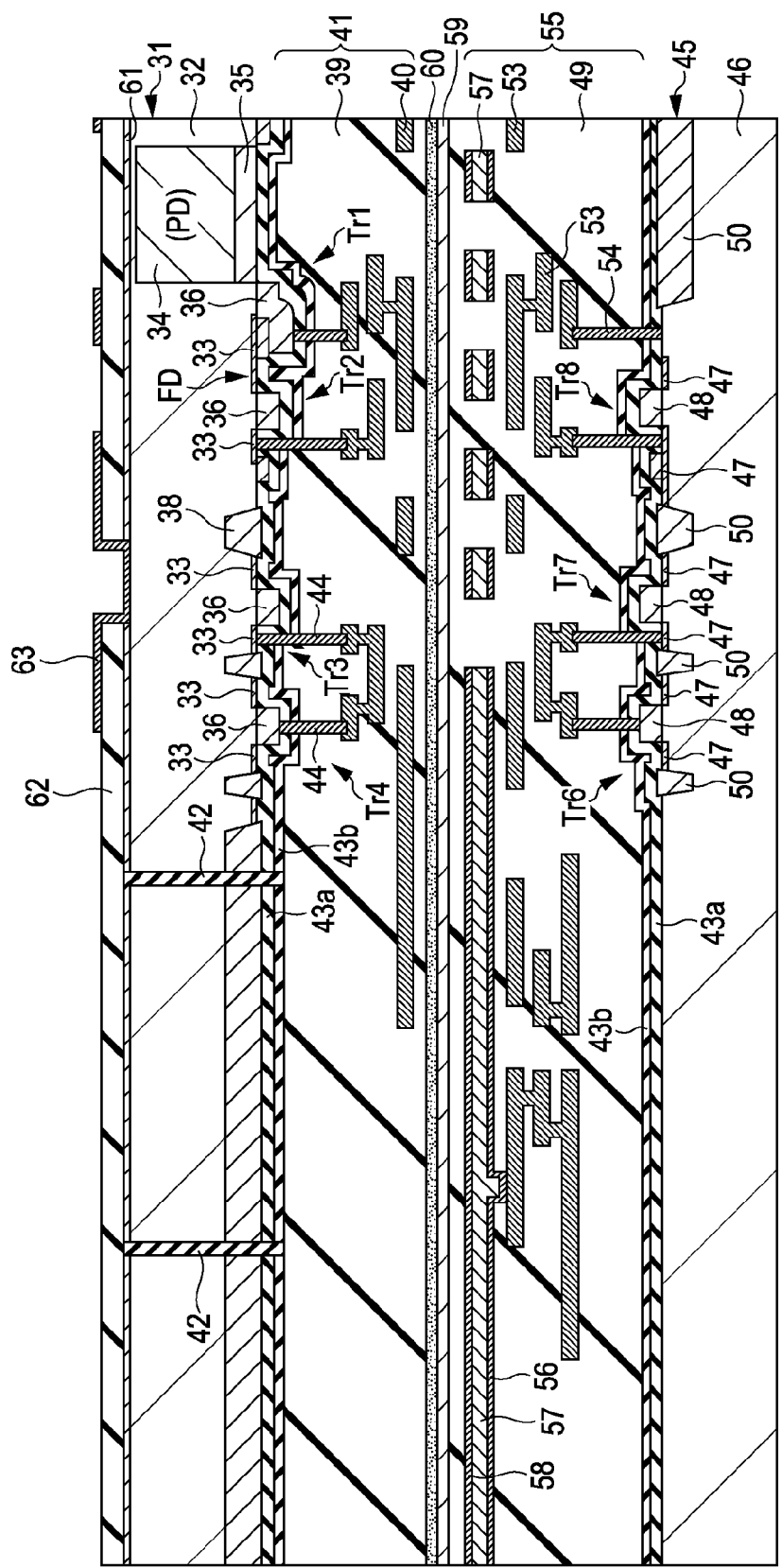
FIG. 8 shows a method for manufacturing the solid-state image pickup device that is consistent with the present invention.

Next, as shown in FIG. 8, an anti-reflection film 61 is formed on the rear surface of the first semiconductor substrate 31. The anti-reflection film 61 may be formed using a $TaO_2$ or a $HfO_2$ film having a thickness of 5 to 100 nm. The anti-reflection film 61 formed of $TaO_2$ or $HfO_2$ has a pinning effect at an interface with the first semiconductor substrate 31, and by this anti-reflection film 61, a dark current generated at the rear surface side interface of the first semiconductor substrate 31 can be suppressed. When an annealing treatment is performed after the anti-reflection film 61 is formed, the anti-reflection film 61 formed of $TaO_2$ or $HfO_2$ is dehydrated. Since the anti-reflection film 61 is dehydrated by this annealing treatment, film peeling of a HDP film or the like which is formed in a subsequent step can be prevented. Subsequently, on the anti-reflection film

61, an HDP film or a P-SiO film having a thickness of 100 to 1,500 nm is formed as a first-layer insulating film 62. Next, after the first-layer insulating film 62 is formed, an opening is formed in a desired region thereof so as to expose the rear surface side of the first semiconductor substrate 31, and a shading film 63 covering the opening is formed in a desired region except for an upper portion of the region in which the photodiode (PD) is formed. The shading film 63 may be formed of tungsten (W) or Al, may be formed as a multilayer film of W/Ti (or Ta or TiN), or may be formed as a multilayer film of Al/Ti (or Ta or TiN). In this case a lower layer film is formed to have a thickness of 50 to 500 nm, and an upper layer film is then formed to have a thickness of 5 to 100 nm.

Figure 9:
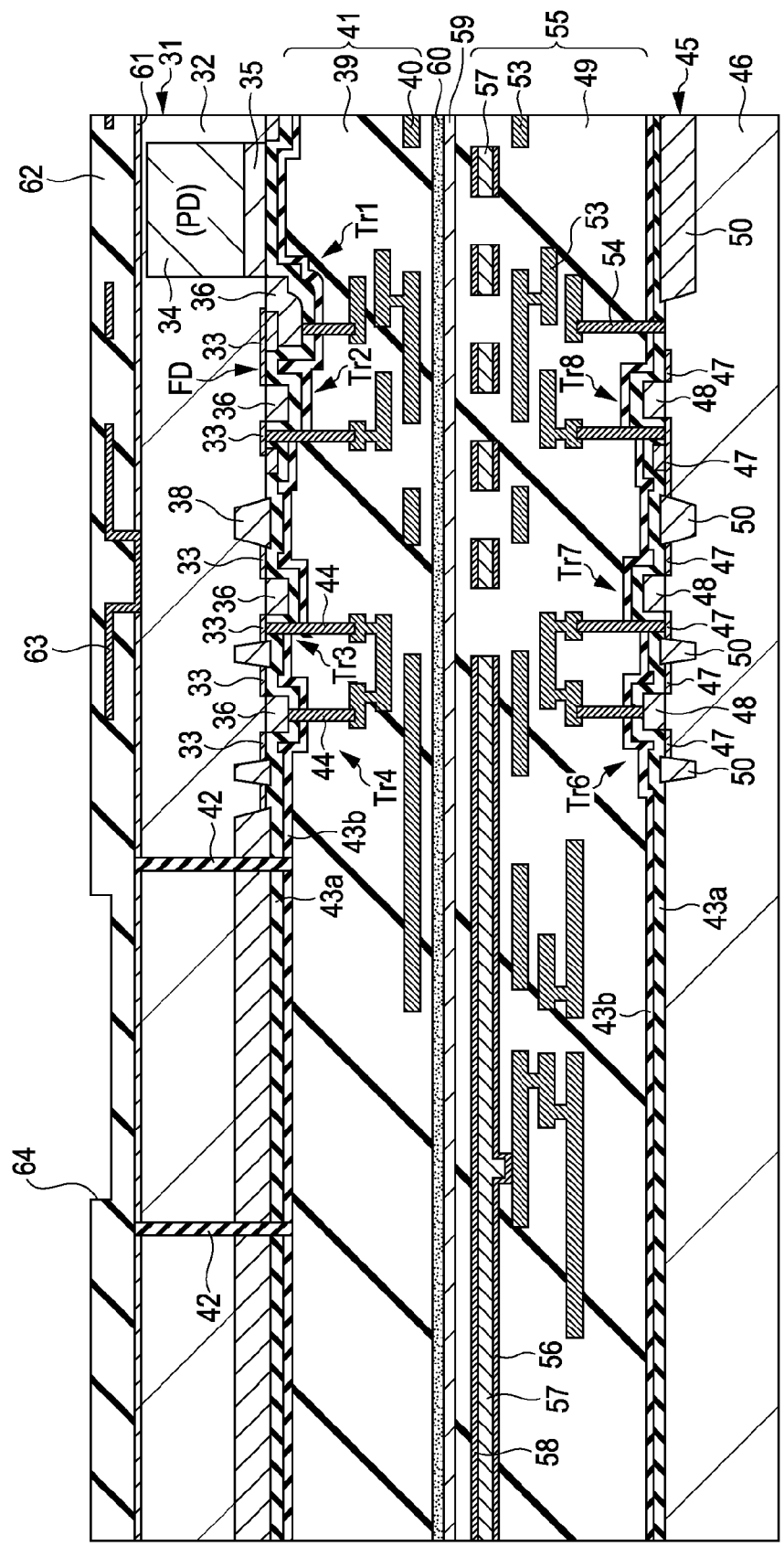
FIG. 9 shows a method for manufacturing the solid-state image pickup device that is consistent with the present invention.

Next, as shown in FIG. 9, an insulating film 62 is further formed using a $SiO_2$ film on the shading film 63, and subsequently, a first groove portion 64 is formed in a desired region inside the insulating spacer layer 42 from the side of the first semiconductor substrate 31 which is the upper substrate. This first groove portion 64 is formed to have a depth not to reach the first semiconductor substrate 31.

Figure 10:
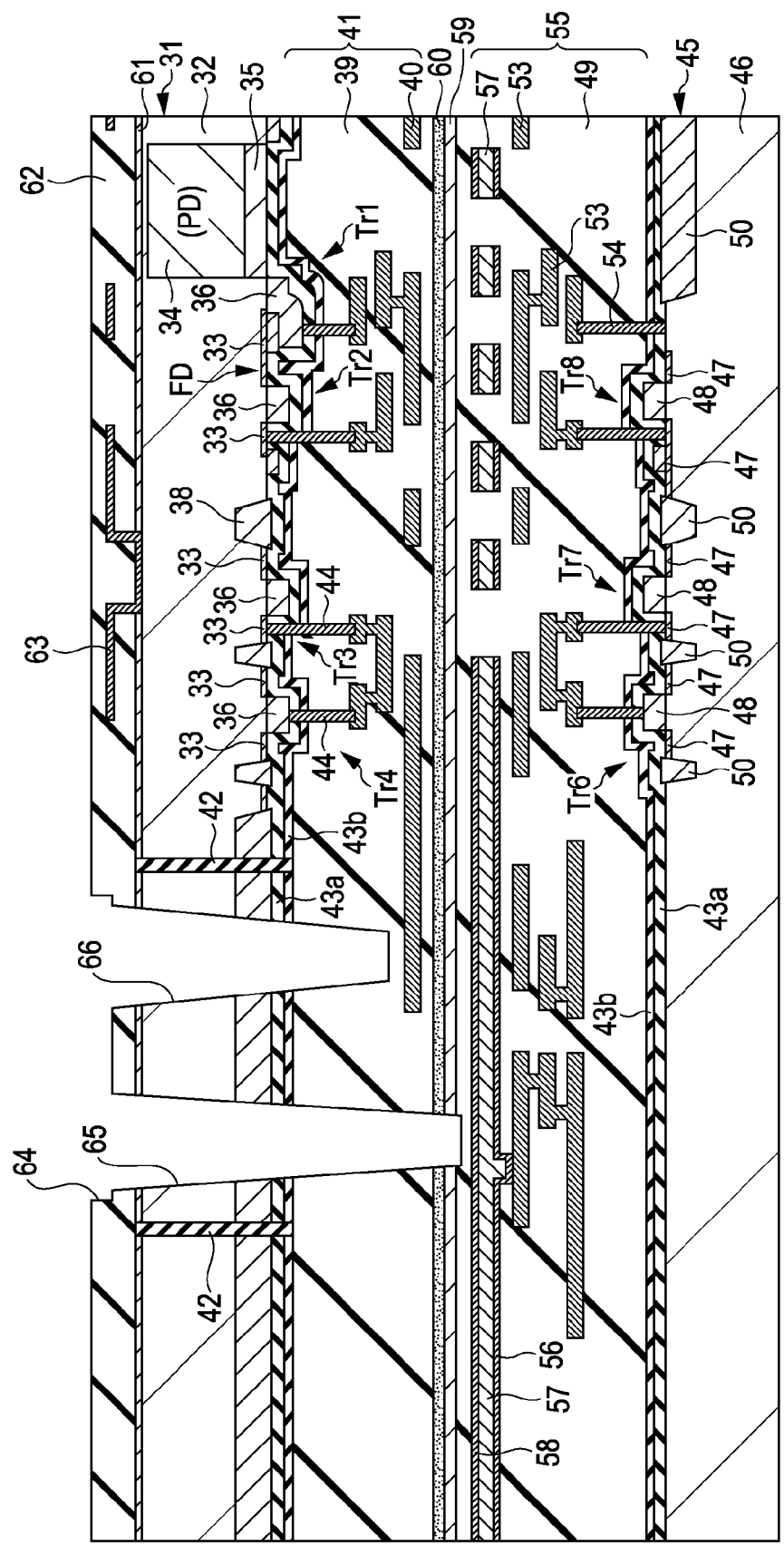
FIG. 10 shows a method for manufacturing the solid-state image pickup device that is consistent with the present invention.

Next, as shown in FIG. 10, in a desired bottom region of the first groove portion 64, an opening is formed which penetrates the adhesion surface between the first semiconductor substrate 31 and the second semiconductor substrate 45 to a depth which is very close to the aluminum wire 57 formed above the second semiconductor substrate 45. As a result, a second groove portion 65 is formed. Next, in a manner similar to that described above, in the desired bottom region of the first groove portion 64, an opening is formed to a depth which is very close to the topmost layer of the copper wire 40 (at a bottommost side in FIG. 10) of the multilayer wire layer 41 formed on the first semiconductor substrate 31. As a result, a third groove portion 66 is formed. Since the second groove portion 65 and the third groove portion 66 are formed after the thickness of the first semiconductor substrate 31 is reduced, the aspect ratio is decreased, and hence, the groove portions can be each formed as a fine hole.

In another embodiment consistent with the present invention shown in FIG. 10B, a single opening 65 is formed that penetrates the adhesion surface between the first semiconductor substrate 31 and the second semiconductor substrate 45 to a depth which is very close to the aluminum wire 57 above the second semiconductor substrate 45 and also the top most copper wire 40. For this embodiment, the manufacturing steps are similar to the manufacturing process including two openings, with only the references to the second opening 64 being omitted.

Figure 11:
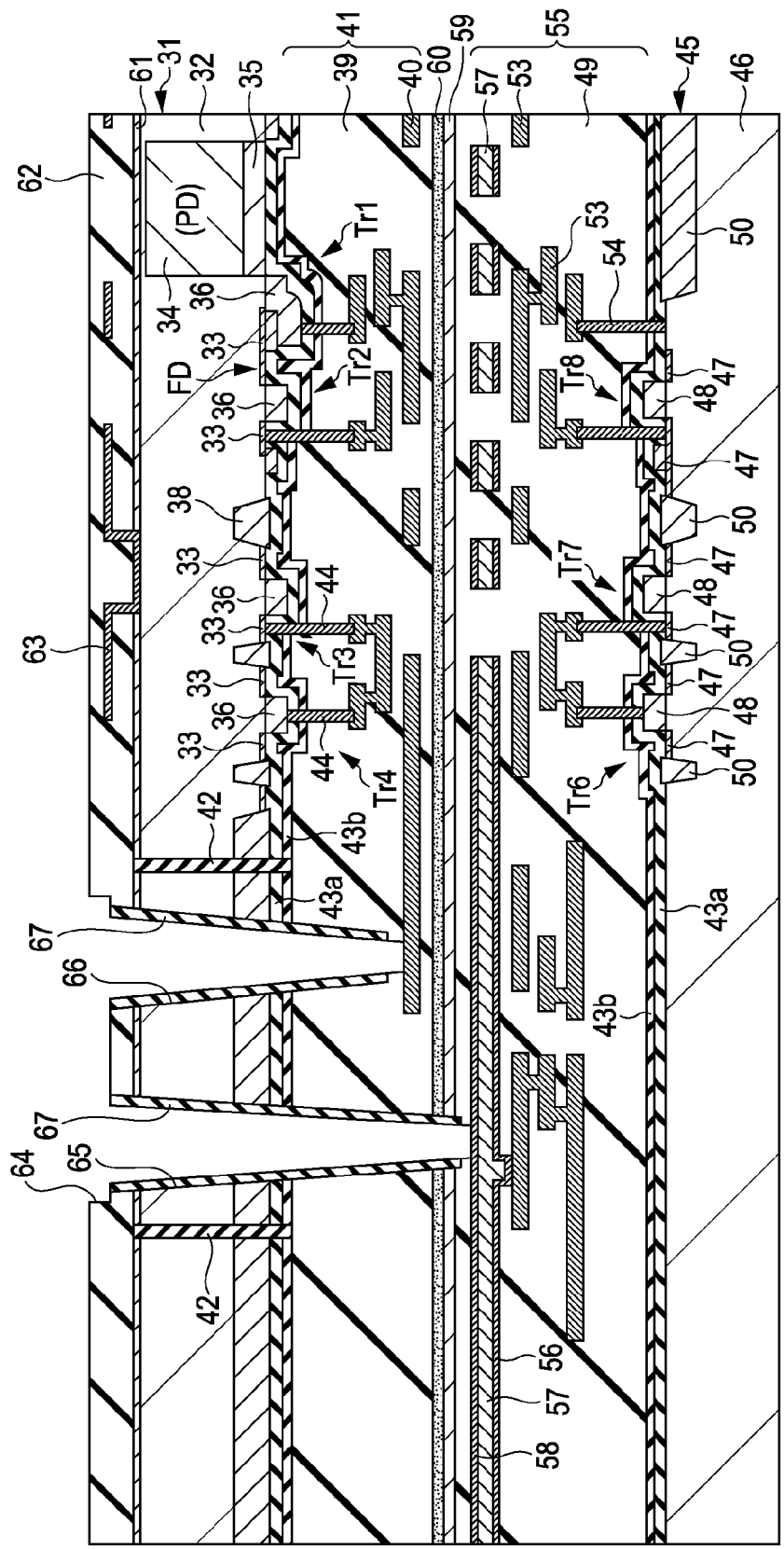
FIG. 11 shows a method for manufacturing the solid-state image pickup device that is consistent with the present invention.

Next, on a region including sidewalls and bottom portions of the first to the third groove portions 64, 65, and 66 an insulating layer 67 of a $SiO_2$ film is formed and is then etched back, so that the insulating layer 67 is allowed to remain only on the sidewalls of the first to the third groove portions as shown in FIG. 11. Subsequently, the bottom portions of the second and the third groove portions 65 and 66 are further removed by etching, so that in the second groove portion 65, the aluminum wire 57 (to be exact, the barrier metal 58 on the aluminum wire) is exposed, and in the third groove portion 66, the topmost-layer copper wire 40 is exposed. Accordingly, the third groove portion 66 is formed as a connection hole which exposes the copper wire 40 formed above the first semiconductor substrate 31, and the second groove portion 65 is formed as a through substrate via hole which penetrates the first semiconductor substrate 31 and which exposes the aluminum wire 57 formed above the second semiconductor substrate 45.

At this stage, steps of forming an on-chip color filter and an on-chip lens, which are parts of a process for manufacturing a pixel array, are not carried out, and hence this process is not completed. In addition, the connection hole formed on the copper wire 40 and the penetration connection hole formed on the aluminum wire 57 can be machined and formed by appropriately using related wafer processes. Furthermore, also in the logic circuit 25, although the optimum topmost-layer metal wire is formed in view of a circuit technique, the entire process for the logic circuit 25 is not completed. As described above, since the different types of semi-finished substrates are adhered to each other, compared to the case in which different types of finished substrates are adhered to each other, the manufacturing cost can be reduced.

Figure 12:
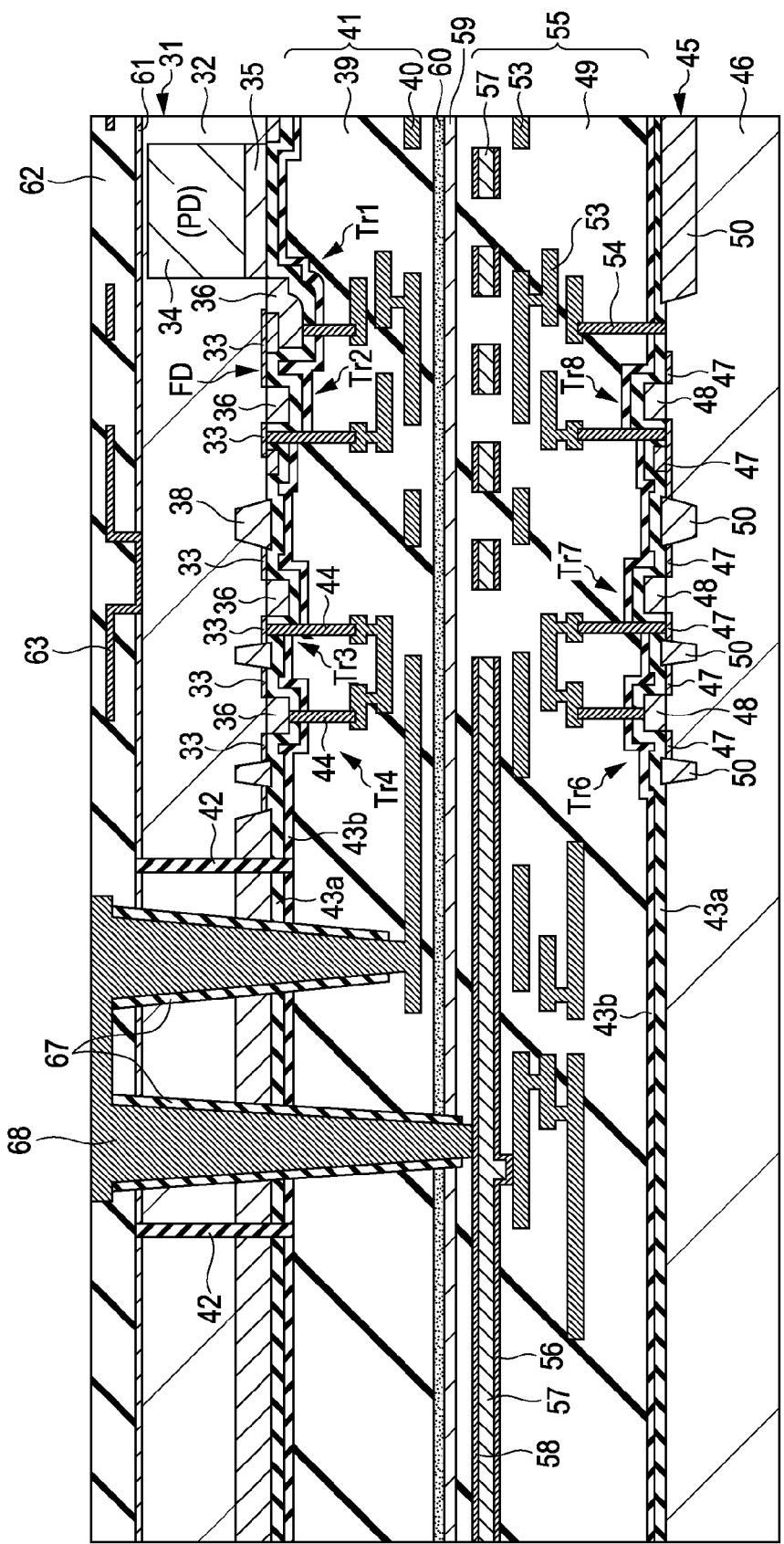
FIG. 12 shows a method for manufacturing the solid-state image pickup device that is consistent with the present invention.

Subsequently, as shown in FIG. 12 connection conductors composed of copper or the like are formed in the first to the third groove portions 64, 65, and 66, so that the inter-substrate wire 68 is formed. In this embodiment example, since the second groove portion 65 and the third groove portion 66 are formed inside the first groove portion 64, the connection conductors (inter-substrate wire 68) formed in the second groove portion 65 and the third groove portion 66 are electrically connected to each other. Hence, the copper wire 40 formed in the multilayer wire layer 41 on the first semiconductor substrate 31 and the aluminum wire 57 formed in the multilayer wire layer 55 on the second semiconductor substrate 45 are electrically connected to each other. In addition, in this case, since the barrier metal layer 58 is formed on the aluminum wire 57 formed in the multilayer wire layer 55 on the second semiconductor substrate 45, even if the inter-substrate wire 68 is formed of copper, the diffusion thereof can be prevented. The insulating layer 67 is formed on the portions of the second groove portion 65 and the third groove portion 66 which penetrate the first semiconductor substrate 31. Accordingly, the inter-substrate wire 68 and the first semiconductor substrate 31 are not electrically connected to each other. In addition, in this embodiment, since the inter-substrate wire 68 is formed in the region of the insulating spacer layer 42 formed in the first semiconductor substrate 31, by this structure, the inter-substrate wire 68 and the first semiconductor substrate 31 are also prevented from being electrically connected to each other.

In the process for forming the inter-substrate wire 68 of this embodiment, the first to the third groove portions 64, 65, and 66 are separately formed in different steps and a damascene method is used to fill copper; however, the process is not limited thereto. Various modifications may be performed as long as the inter-substrate wire 68 is formed which electrically connects the copper wire 40 of the multilayer wire layer 41 on the first semiconductor substrate 31 to the aluminum wire 57 of the multilayer wire layer 55 on the second semiconductor substrate 45.

In this embodiment, the case in which the insulation between the inter-substrate wire 68 and the first semiconductor substrate 31 is performed by the insulating layer 67 and the insulating spacer layer 42 is descried by way of; however, the insulation may be preformed by one of them. When the insulating spacer layer 42 is not formed, since the region for the insulating spacer layer 42 is not necessary, the reduction in pixel area and/or the increase in area of the photodiode (PD) can be performed.

Figure 13:
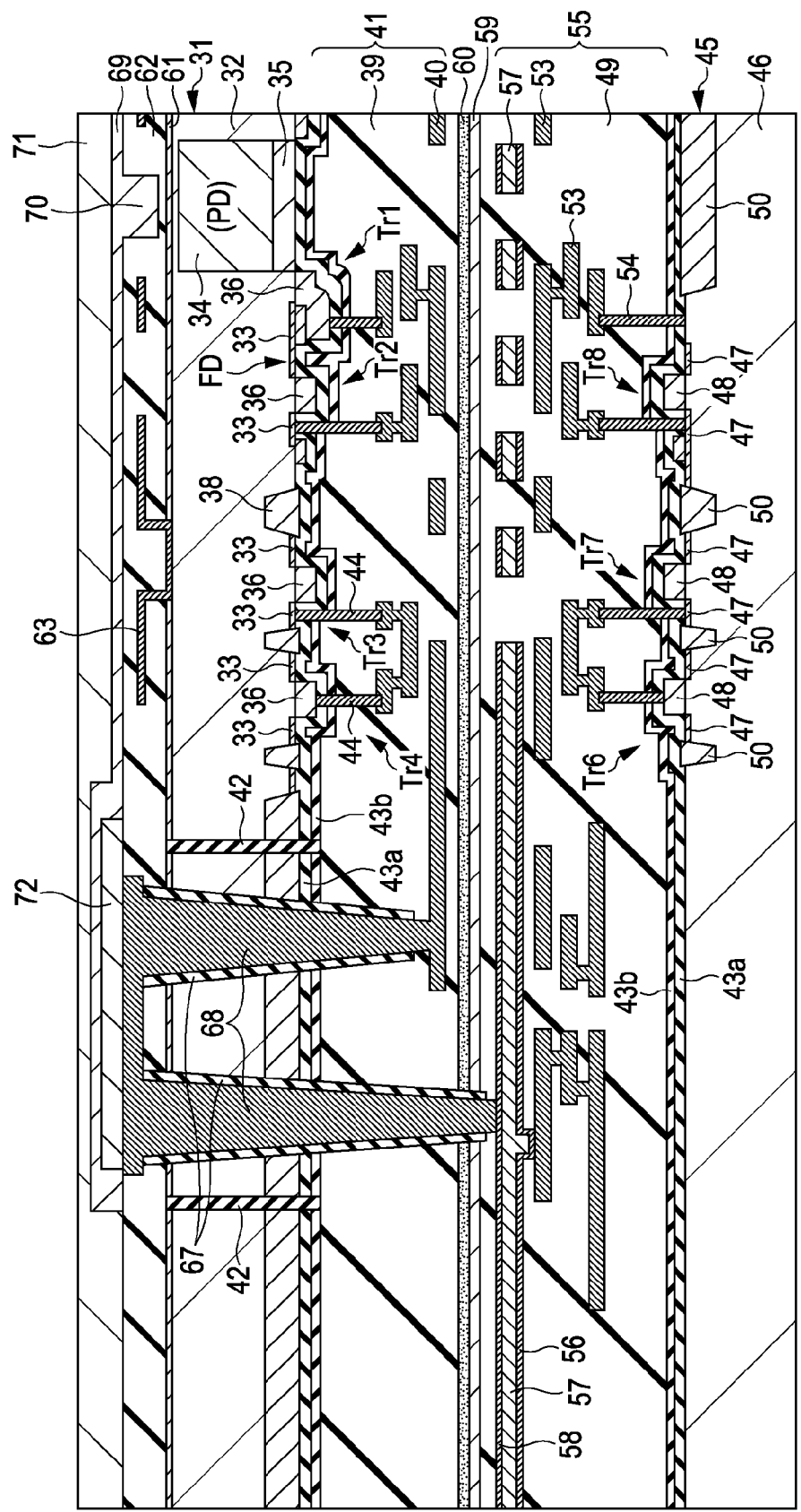
FIG. 13 shows a method for manufacturing the solid-state image pickup device that is consistent with the present invention.

Next, as shown in FIG. 13, a cap film 72 is formed so as to cover an upper portion of the inter-substrate wire 68. This cap film 72 may be formed using a SiN film or a SiCN film having a thickness of 10 to 150 nm. Subsequently, an opening portion is formed in the insulating film 62 above the photodiode (PD), and a waveguide material film 69 is formed on a desired region including the opening portion described above. For the waveguide material film 69 SiN may be used, and by the waveguide material film 69 formed in the opening portion, a waveguide path 70 is formed. Since the waveguide path 70 is formed, light incident from the rear surface side of the first semiconductor substrate 31 is efficiently condensed to the photodiode (PD). Subsequently, a planarization film 71 is formed on the entire surface including the waveguide material film 69.

In this embodiment, although the cap film 72 and the waveguide material film 69 provided thereon are formed in separate steps, the waveguide material film 69 may also be used as the cap film 72. In addition, in this embodiment example, although the case in which the waveguide path 70 is formed at the light incident surface side of the photodiode (PD) is described by way of example, the waveguide path 70 may not be formed in some cases. Furthermore, in this embodiment, although the case in which the inter-substrate wire 68 is formed after the shading film 63 is formed is described by way of example, before the shading film 63 is formed, the through substrate via hole and the connection hole are formed, and subsequently, the inter-substrate wire 68 may then be formed. In this case, since the inter-substrate wire 68 is covered with the shading film 63, the shading film 63 may also be used as the cap film for the inter-substrate wire 68. According to the structure as described above, the number of manufacturing steps can be reduced.

Figure 14:
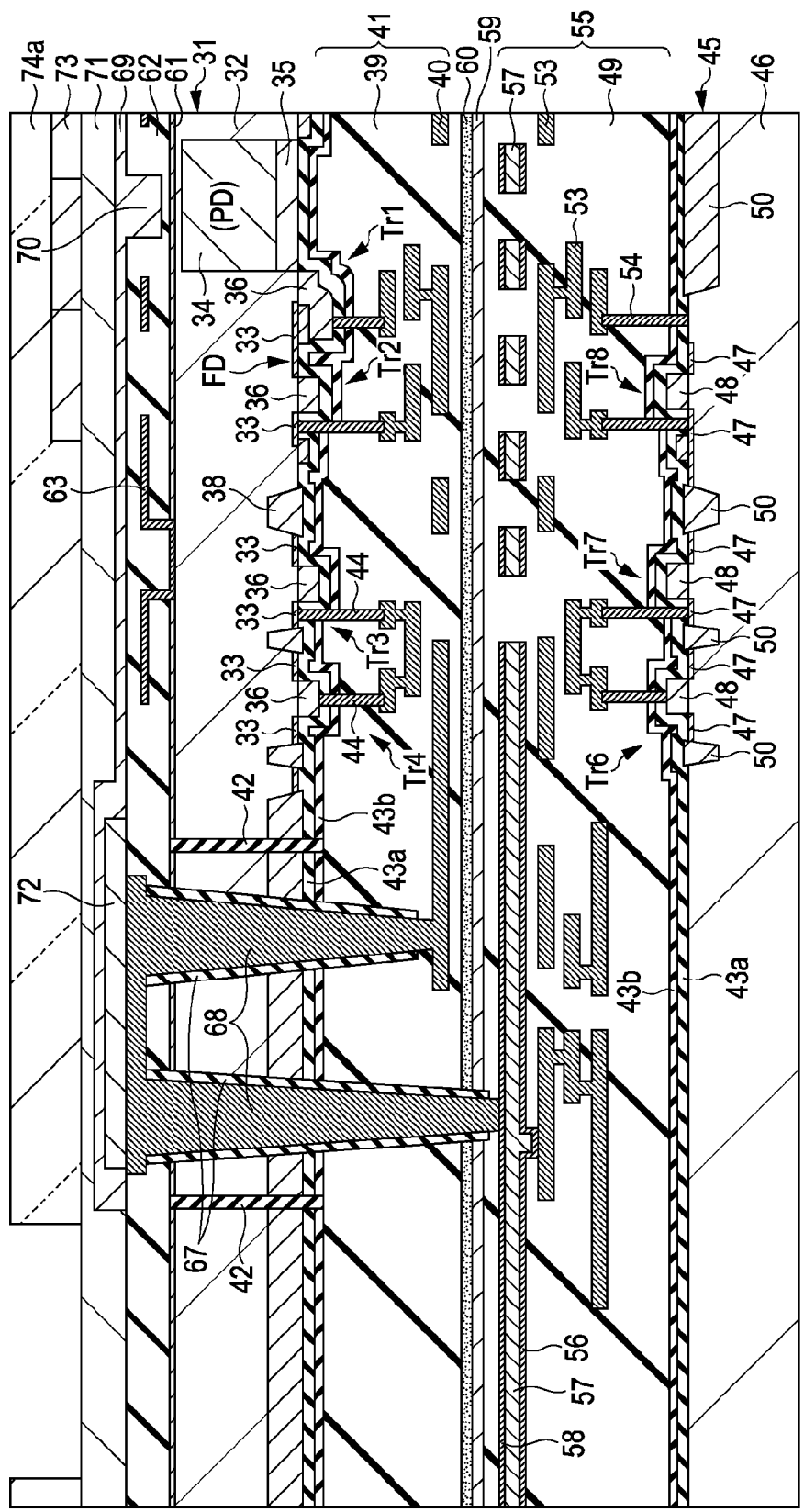
FIG. 14 shows a method for manufacturing the solid-state image pickup device that is consistent with the present invention.

Next, as shown in FIG. 14 red (R), green (G), and blue (B) on-chip color filters 73 are formed on the planarization film 71 so as to correspond to the individual pixels. The on-chip color filter 73 can be formed on upper portions of photodiodes (PDs) forming a desired pixel array by the steps of forming an organic film containing a pigment or a dye having a desired color and patterning the film thus formed. Subsequently, a film of an on-chip lens material 74a is formed on a pixel array region including the upper portion of the on-chip color filters 73. As the on-chip lens material 74a an organic film or an inorganic film of SiO, SiN, SiON, or the like may be formed to have a thickness of 3,000 to 4,500 nm.

Figure 15:
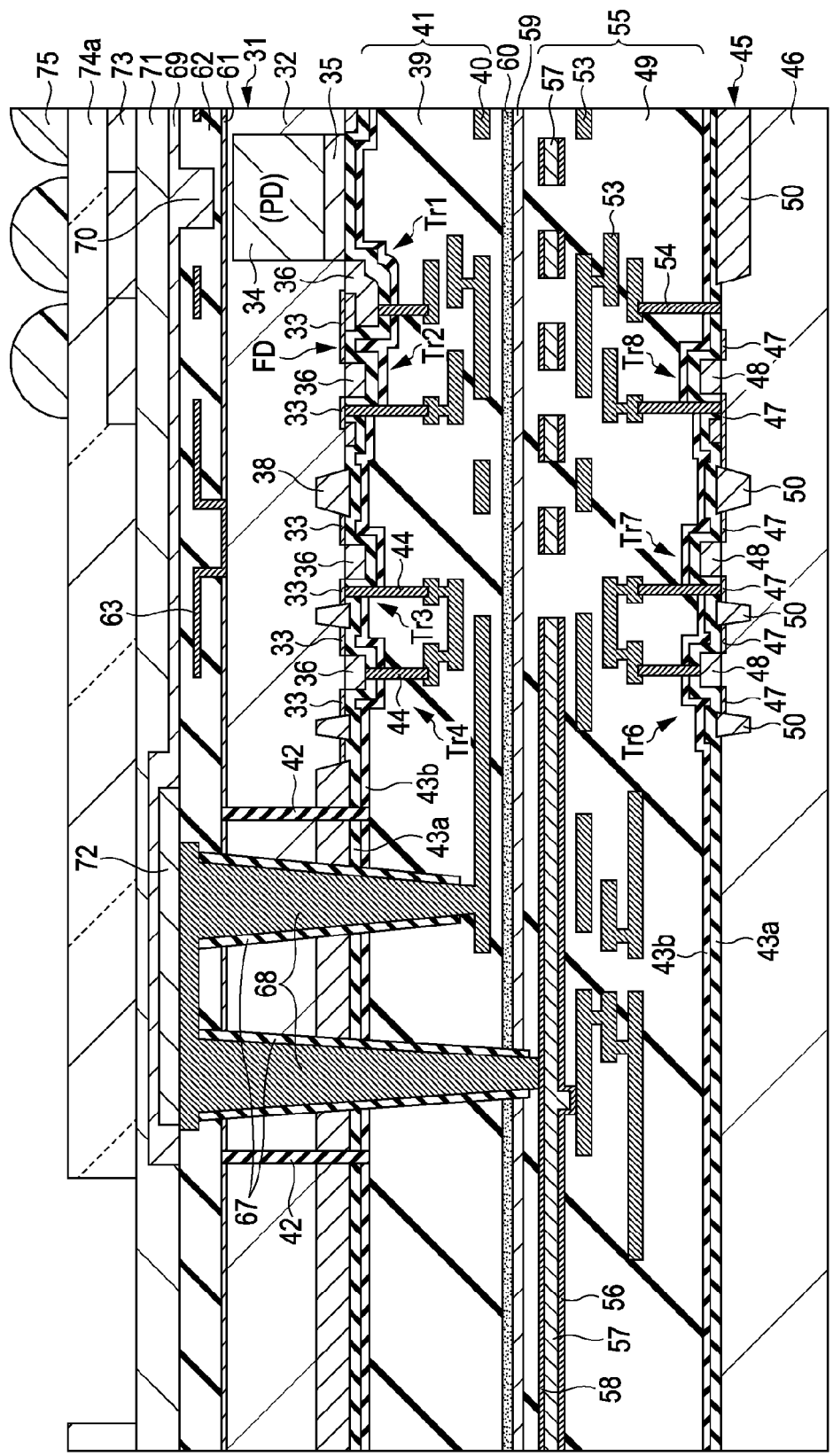
FIG. 15 shows a method for manufacturing the solid-state image pickup device that is consistent with the present invention.
Figure 16:
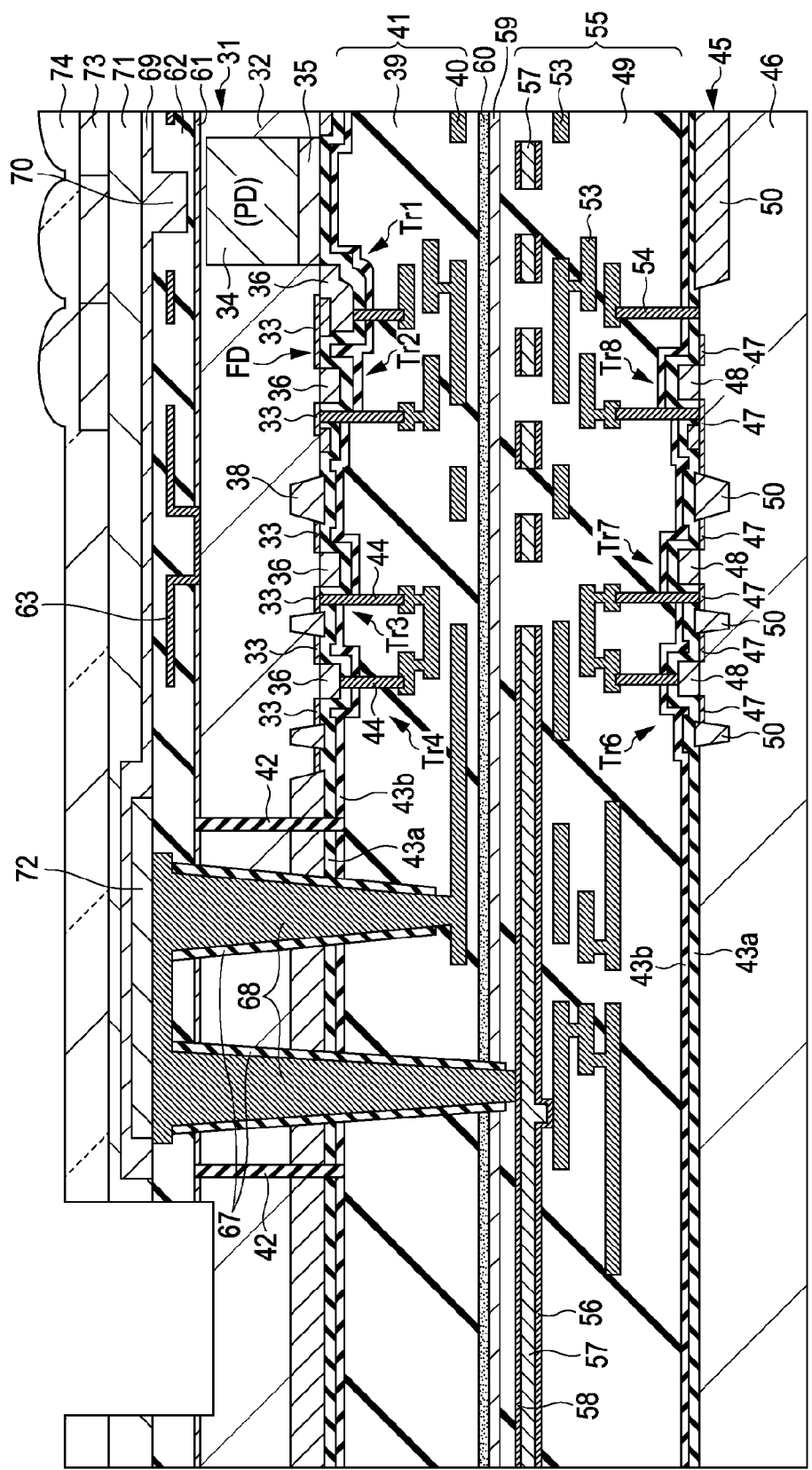
FIG. 16 shows a method for manufacturing the solid-state image pickup device that is consistent with the present invention.

Next, as shown in FIG. 15, after a resist film 75 for an on-chip lens is formed on the on-chip lens material 74a in regions corresponding to the individual pixels to have a thickness of 300 to 1,000 nm, an etching treatment is performed. Accordingly, the shape of the resist film 75 for an on-chip lens is transferred to the on-chip lens material 74a, and as shown in FIG. 16, an on-chip lens 74 is formed on the individual pixels. Subsequently, the oxide films, such as the insulating film 62, formed on the first semiconductor substrate 31 are etched by a $CF_4$-based gas (flow rate: 10 to 200 sccm), so that the first semiconductor substrate 31 is exposed.

Figure 17:
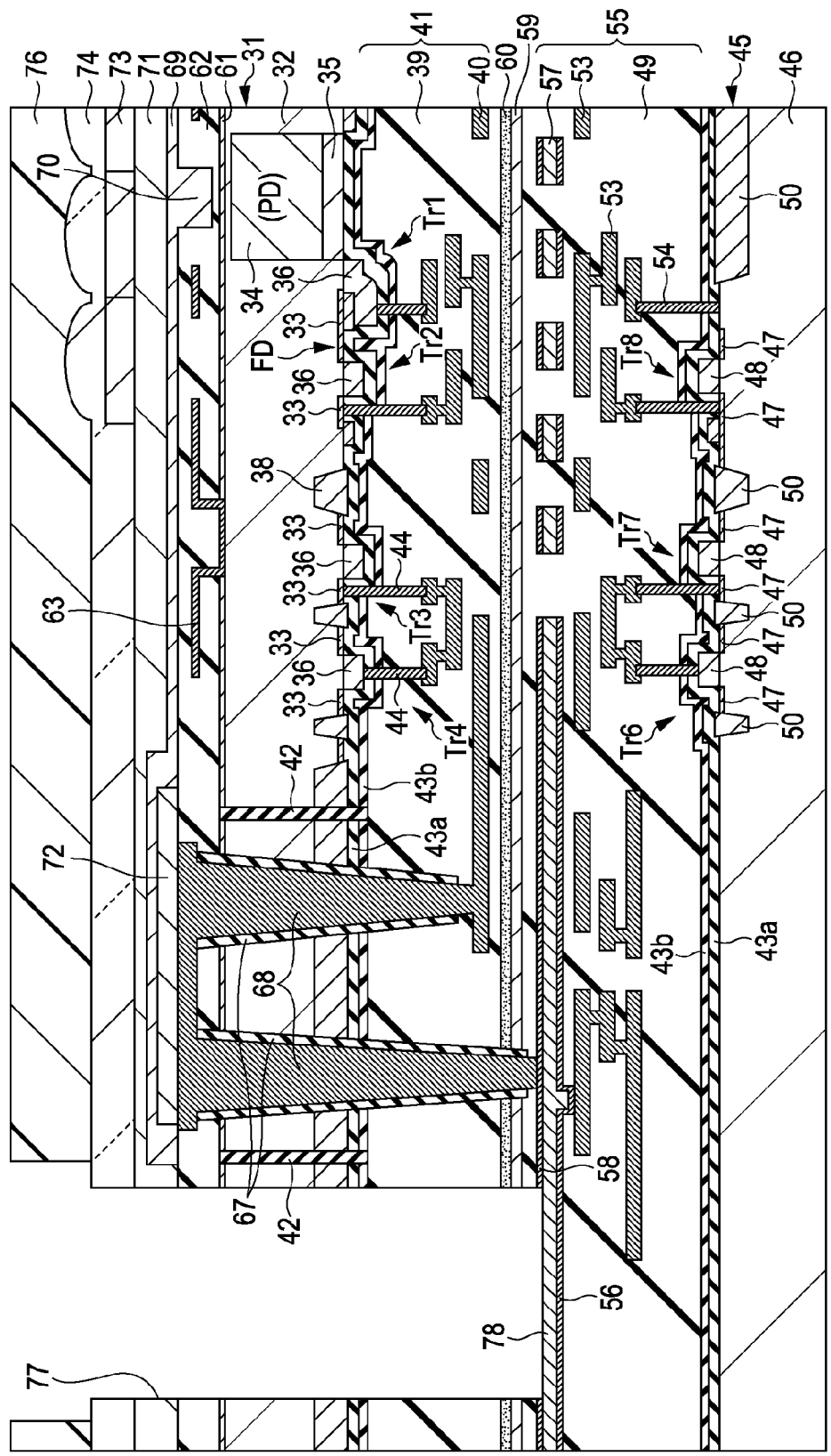
FIG. 17 shows a method for manufacturing the solid-state image pickup device that is consistent with the present invention.

Next, as shown in FIG. 17, a resist film 76 having an opening at the electrode pad portion 78 shown in FIG. 3 is formed on the on-chip lens 74. As shown in FIG. 17, this resist film 76 is formed so that the end portion of the opening is located closer to the pixel side than the end portion of the on-chip lens 74.

Figure 18:
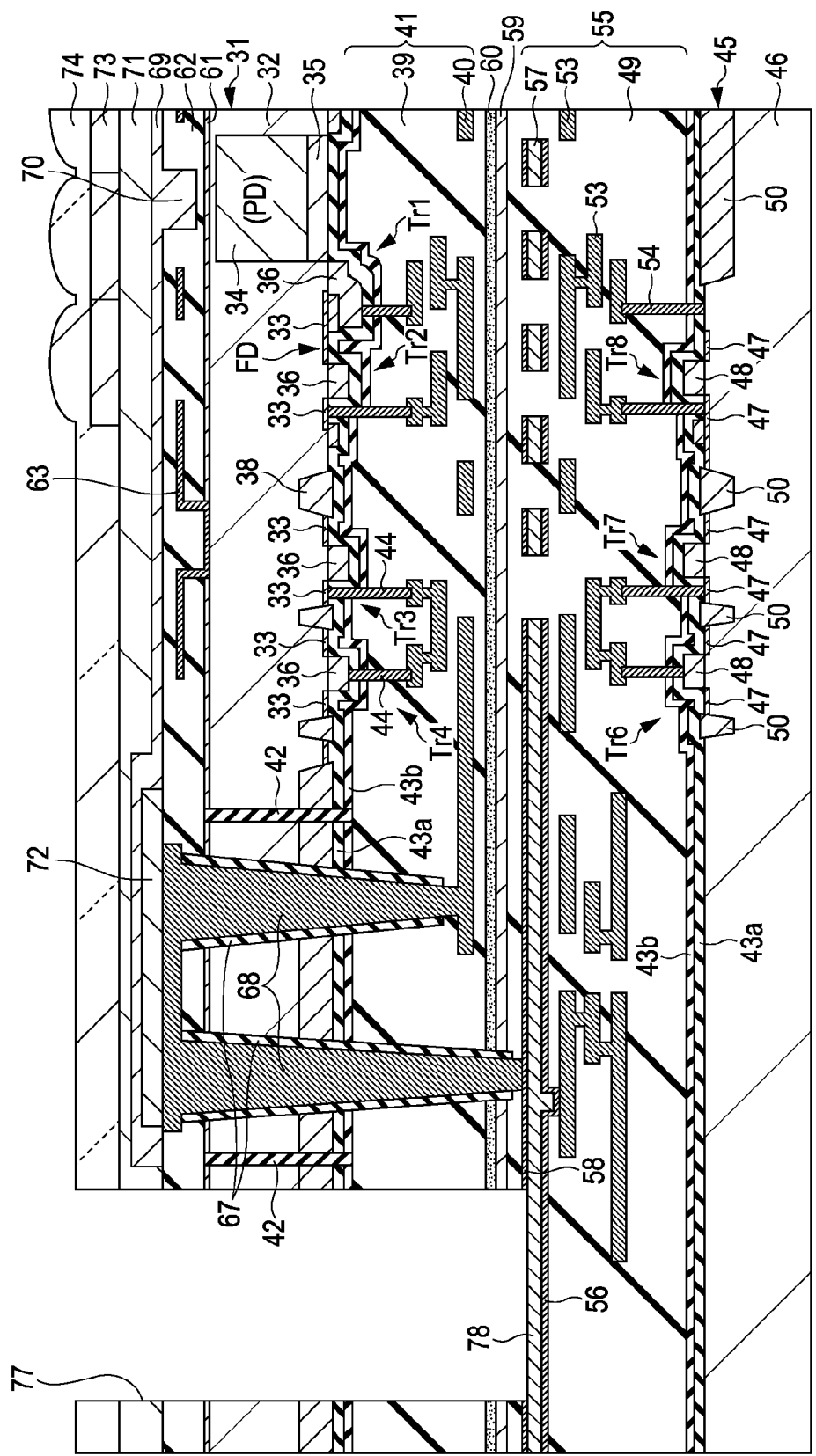
FIG. 18 shows a method for manufacturing the solid-state image pickup device that is consistent with the present invention.

Next, an etching treatment is performed under desired etching conditions using the resist film 76 as a mask. Accordingly, as shown in FIG. 18, etching is started from the side of the first semiconductor substrate 31 which is the topmost substrate, and a through substrate opening portion 77 is formed which penetrates the first semiconductor substrate 31 and the bonding surface between the first semiconductor substrate 31 and the second semiconductor substrate 45. In addition, the through substrate opening portion 77 is formed to expose the aluminum wire 57 formed in the multilayer wire layer 55 on the second semiconductor substrate 45 which is the bottommost substrate. This etching step is performed using a $SF_6/O_2$-based gas (flow rate of $SF_6$: 50 to 500 sccm, and flow rate of $O_2$: 10 to 300 sccm) for 1 to 60 minutes, so that the first semiconductor substrate 31 can be etched away. Subsequently, by an etching treatment performed for 1 to 100 minutes using a $CF_4$-based gas (flow rate: 10 to 150 sccm), the oxide films and the like formed to the aluminum wire 57 can be etched away.

The aluminum wire 57 thus exposed is used as the electrode pad portion 78 which is used for connection to an external wire. Hereinafter, the aluminum wire 57 thus exposed is called the electrode pad portion 78. A plurality of the electrode pad portions 78 is preferably formed along each of three or four external sides of the pixel region formed in each chip.

In addition, the laminate 81a formed by laminating the two semiconductor substrates as shown in FIG. 18 is subsequently divided into chips by dicing, so that the solid-state image pickup device 81 of this embodiment is completed. In this embodiment, when the electrode pad portion 78 is exposed, groove portions each functioning as a crack stopper used in chip division can be formed at the same time.

Figure 19A:
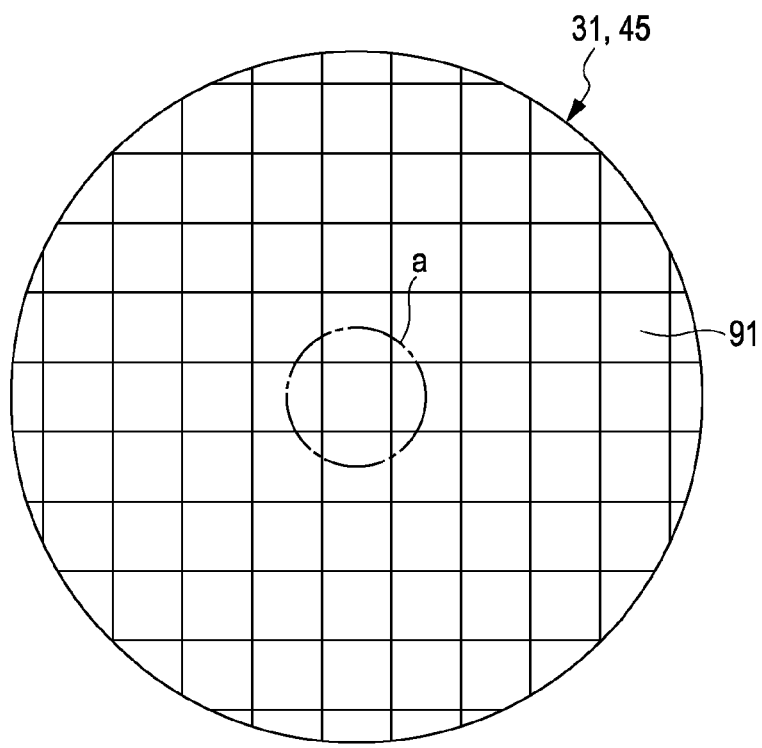
FIGS. 19A and 19B are a schematic structural view showing the semiconductor wafer and an enlarged view of a region that is consistent with the present invention.
Figure 19B:
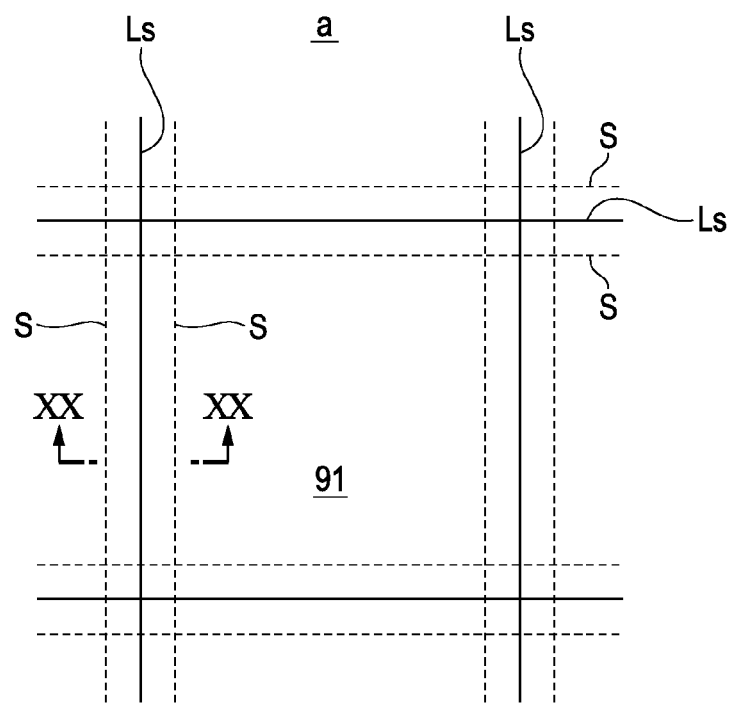

FIG. 19A is a schematic structural view of the laminate 81a formed of the first semiconductor substrate 31 and the second semiconductor substrate 45 before being divided into chips, and FIG. 19B is an enlarged view of a chip portion 91 shown in a region a of FIG. 19A. In addition, FIG. 20 is a schematic cross-sectional view along the line XX-XX of FIG. 19B and shows a region including the electrode pad portion 78 formed in one chip portion 91 and a scribe line Ls adjacent to the electrode pad portion 78.

As shown in FIG. 19B, a plurality of chip portions 91 formed on the first semiconductor substrate 31 (second semiconductor substrate 45) are divided along the scribe lines Ls each shown by a solid line. In addition, in this embodiment, as shown in FIG. 20, in a region between adjacent chips and at two sides of the scribe line Ls, groove portions 89 are simultaneously formed when an opening step to expose the electrode pad portion 78 is performed. These groove portions 89 each function as a crack stopper s.

Figure 20:
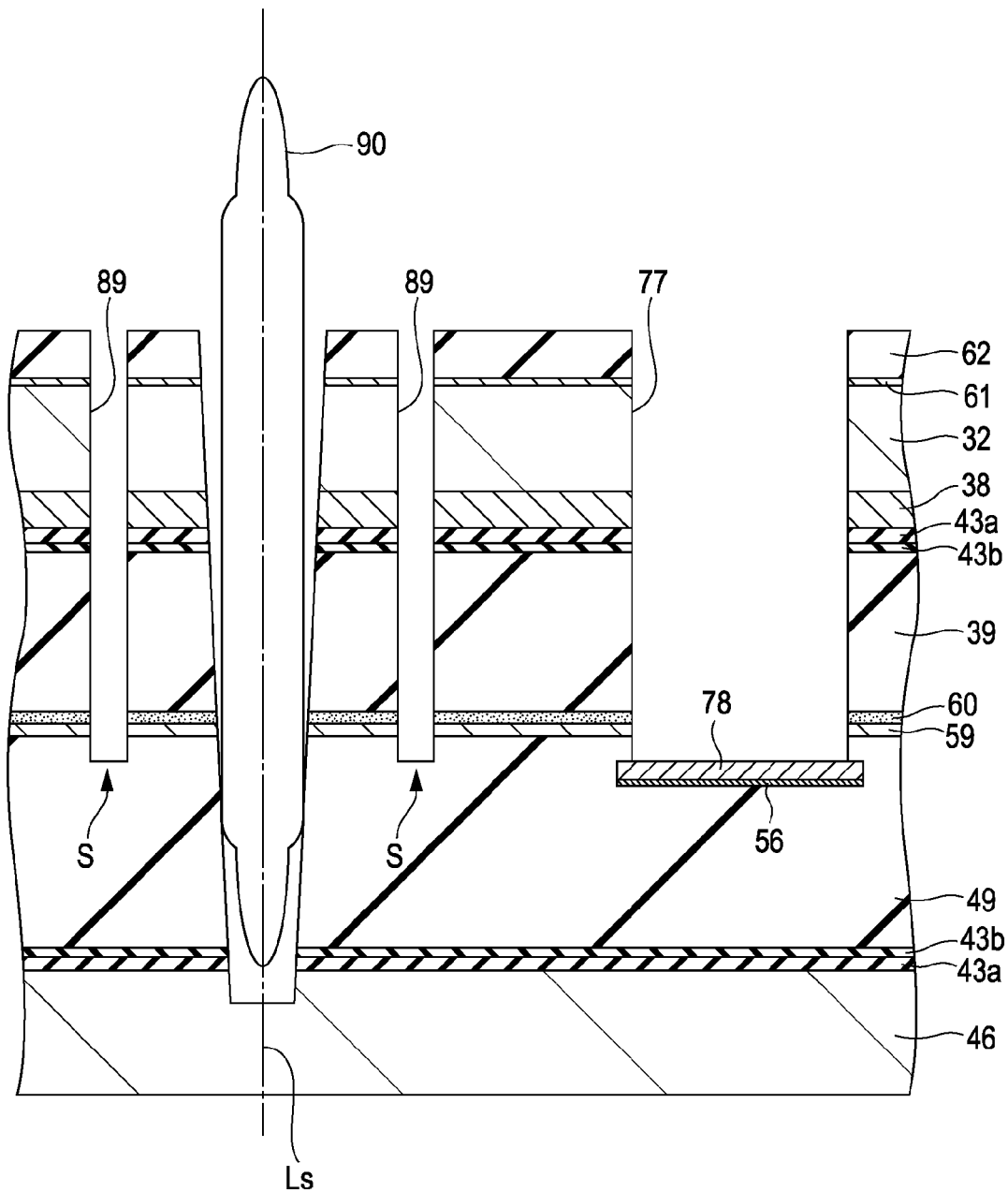
FIG. 20 is a schematic structural view that is consistent with the present invention that depicts a cross section including an electrode pad portion and a scribe line.

In this embodiment, as shown in FIG. 20, after the groove portions 89 each functioning as the crack stopper s are formed at the two sides of the scribe line Ls, dividing is performed along the scribe line Ls by a dicing blade 90. Accordingly, at a fragile surface, such as the adhesion surface between the first semiconductor substrate 31 and the second semiconductor substrate 45, cracks can be prevented from being propagated in dicing operation. Hence, cracks are prevented from being generated in the chip portion 91 when it is divided.

As shown in FIG. 3, a bonding wire 79 is connected to the electrode pad portion 78, so that each chip 91 thus divided can be connected to an external wire of a mounting substrate by this bonding wire 79. In addition, since the external wire is electrically connected to the electrode pad portion 78, the multilayer wire layers 41 and 55 on the first and the second semiconductor substrates 31 and 45, respectively, which are connected to each other by the inter-substrate wire 68 are also electrically connected to the external wire.

In the solid-state image pickup device according to the first embodiment, although the case in which the bonding wire 79 is connected to the electrode pad portion 78 is described by way of example, the electrode pad portion 78 and the external wire may be connected to each other by using a solder bump. Depending on a user's request, the bonding wire or the solder bump may be selected.

In the first embodiment, inspection of the solid-state image pickup devices in a semiconductor wafer state is performed using the electrode pad portions 78. In addition, two inspections, that is, an inspection in a wafer state and an inspection in a final module state obtained by chip division, are performed.

In the solid-state image pickup device according to the first embodiment and the manufacturing method thereof, the pixel region 23 and the control circuit 24 are formed on a chip portion of the first semiconductor substrate 31, and the logic circuit 25 performing signal processing is formed on a chip portion of the second semiconductor substrate 45. Since the pixel array function and the logic function are formed on different chip portions, optimal process techniques may be respectively used for the pixel array and the logic circuit. Hence, the respective performances of the pixel array and the logic circuit can be sufficiently obtained, and as a result, a high performance solid-state image pickup device can be provided.

When the structure shown in FIG. 2C is used, the pixel region 23 receiving light may only be formed at the semiconductor chip portion 22 side, and the control circuit 24 for the pixel region 23 and the logic circuit 25 may be separately formed in the second semiconductor chip portion 26. Accordingly, optimal process techniques necessary for the respective functional chips can be independently selected, and in addition, the area of the product module can also be reduced.

Since the pixel array and the logic circuit can be mounted in combination by related wafer process techniques which have been commonly used, the manufacturing can be easily performed.

In addition, in this embodiment, after the first semiconductor substrate 31 on which the pixel region 23 and the control circuit 24 are provided in a semi-finished making state and the second semiconductor substrate 45 on which the logic circuit 25 is provided in a semi-finished making state are adhered to each other, the thickness of the first semiconductor substrate 31 is reduced. That is, the second semiconductor substrate 45 is used as a support substrate when the thickness of the first semiconductor substrate 31 is reduced. Hence, the number of constituent members can be reduced, and the number of manufacturing steps can be reduced. Furthermore, since the through substrate via hole (second groove portion 65) and the connection hole (third groove portion 66) are formed after the thickness reduction is performed, the aspect ratio of each hole is decreased, and highly precise connection holes can be formed. In addition, since the inter-substrate wire 68 is filled in the through substrate via hole and the connection hole, each having a low aspect ratio, as a matter of course, a metal material, such as tungsten (W), having superior covering properties can be used, and in addition, a metal material, such as copper (Cu), having inferior covering properties may also be used. That is, a connection conductor material is not particularly limited. Hence, the electrical connection of the logic circuit to the pixel region and the control circuit can be performed with high accuracy. Accordingly, a high performance solid-state image pickup device can be manufactured which improves mass productivity and reduces manufacturing cost.

Furthermore, in this embodiment, the through substrate opening portion 77 formed to expose the electrode pad portion 78 penetrates the bonding surface between the first semiconductor substrate 31 and the second semiconductor substrate 45, and the electrode pad portion 78 is formed of the wire above the second semiconductor substrate 45 which is the lower substrate. Accordingly, the electrode pad portion 78 is formed at a lower layer than the bonding surface between the first semiconductor substrate 31 and the second semiconductor substrate 45 which is considered to be a fragile surface. Hence when the bonding wire 79 is pressed to the electrode pad portion 78, a bonding stress applied to the bonding surface which is a fragile surface can be reduced. As a result, in wire bonding, cracks are prevented from being generated from the fragile bonding surface (bonding surface between the first semiconductor substrate 31 and the second semiconductor substrate 45 in this embodiment).

In this embodiment, although the two semiconductor wafers are laminated to each other, the present invention may also be applied to the structure in which at least two semiconductor wafers are laminated to each other. In this case, a through substrate opening portion is formed so as to expose a wire of a wire layer above the bottommost semiconductor water, and the wire thus exposed is used as an electrode pad portion. Accordingly, when the electrode pad portion and an external wire are connected to each other, the generation of stress at a fragile bonding surface between the substrates can be suppressed.

In addition, as in this embodiment, in the backside illuminated solid-state image pickup device, since the photodiode functioning as a light receiving portion is necessarily disposed close to the circuit, the reduction in thickness of the semiconductor layer has to be performed. In addition, the depth of the opening which exposes the wire located at a lower side than the bonding surface is preferably reduced. Hence, when a solid-state image pickup device has an upper semiconductor substrate (the first semiconductor substrate in this embodiment) on which a pixel array is provided as in this embodiment, the opening is preferably formed from the side of the first semiconductor substrate, the thickness of which is reduced, to expose the electrode pad portion.

Figure 21:
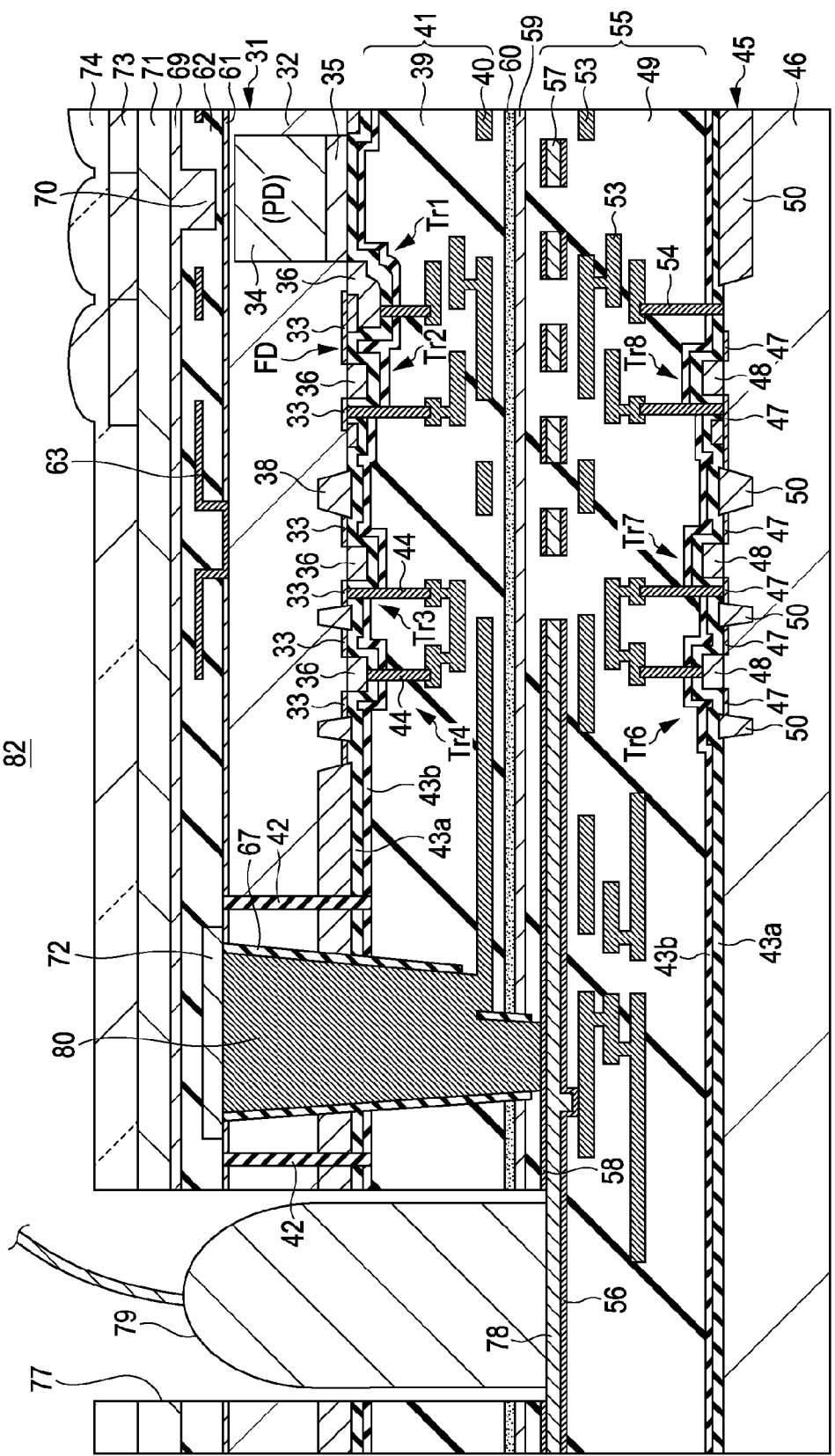
FIG. 21 is a schematic structural view consistent with the present invention that depicts a solid-state image pickup device.

FIG. 21 is a schematic structural view showing a solid-state image pickup device according to a second embodiment of the present invention. As in FIG. 3, FIG. 21 is a schematic structural view showing an area including a region in which a pad portion is formed. A solid-state image pickup device 82 of this embodiment shows one structural example in which since an inter-substrate wire 80 is formed from one connection hole, a pixel region and a control circuit at a first semiconductor substrate 31 side and a logic circuit at a second semiconductor substrate 45 side are electrically connected to each other. In FIG. 21, elements corresponding to those shown in FIG. 3 are designated by the same reference numerals and descriptions thereof are omitted.

In this embodiment, the inter-substrate wire 80 electrically connecting between the first semiconductor substrate 31 and the second semiconductor substrate 45 penetrates the first semiconductor substrate 31 from a rear surface side thereof and reaches a topmost-layer aluminum wire 57 above the second semiconductor substrate 45. Furthermore, the inter-substrate wire 80 partly reaches a copper wire 40 above the first semiconductor substrate 31. In this embodiment, after an insulating film is formed on an inside wall surface of the connection hole, a conductor is filled in the connection hole, so that the inter-substrate wire 80 is formed which connects the wire at a logic circuit side and the wire at a pixel region and a control circuit side.

In addition, in this embodiment, a shading film 63 is formed after the inter-substrate wire 80 is formed. In this case, after the inter-substrate wire 80 is formed, a cap film 72 is formed on an upper portion of the inter-substrate wire 80, and subsequently, the shading film 63 may be formed.

In the solid-state image pickup device of this embodiment, the logic circuit is electrically connected to the pixel region and the control circuit by one inter-substrate wire 80. Hence, compared to the case of the first embodiment, the structure is simplified, and the number of manufacturing steps can also be reduced. Accordingly, the manufacturing cost can be further reduced. In addition, advantages similar to those of the first embodiment can also be obtained.

In the solid-state image pickup device of the above embodiment, although the structure is formed such that electrons are used as the signal charge, the first conduction type is a p type, and the second conduction type is an n type, the present invention may also be applied to a solid-state image pickup device in which holes are used as the signal charge. In this case, the conduction types of respective semiconductor substrates, semiconductor well regions, or semiconductor regions are reversed, so that an n type is used as the first conduction type and a p type is used as the second conduction type.

In the first embodiment described above, although the MOS solid-state image pickup device is described by way of example, the present invention may also be applied to a semiconductor device. Next, as a third embodiment of the present invention, a semiconductor device in which different types of chips are laminated to each other will be described.

Figure 22:
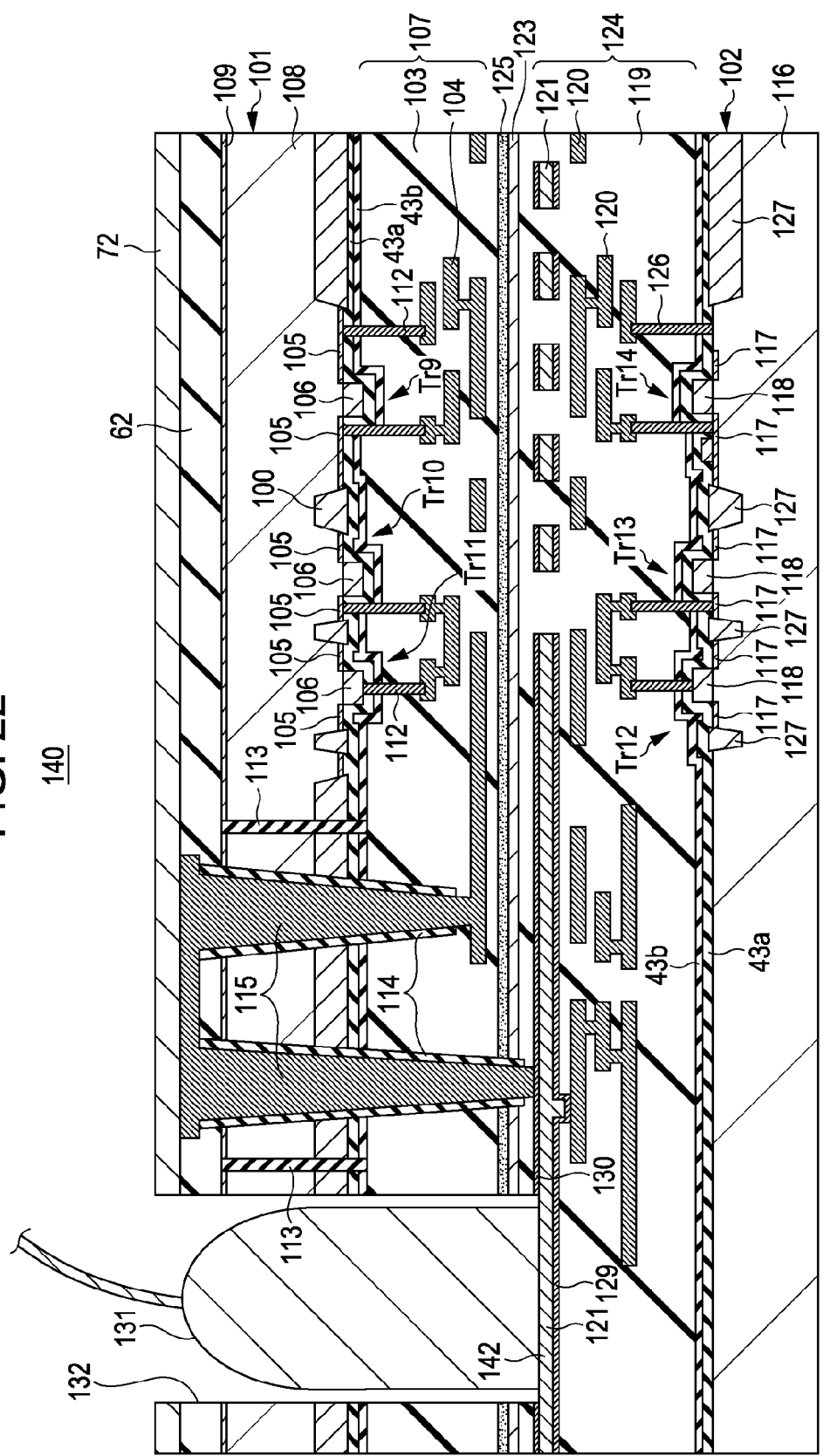
FIG. 22 is a schematic structural view consistent with the present invention that depicts a solid-state image pickup device.

With reference to FIG. 22 and FIGS. 23 to 28, a semiconductor device according to a third embodiment of the present invention and a manufacturing method thereof will be described. A semiconductor device 140 of this embodiment is a semiconductor device including a first semiconductor substrate 101 on which a first semiconductor integrated circuit is formed and a second semiconductor substrate 102 on which a second semiconductor integrated circuit is formed, the first and the second semiconductor substrates being laminated to each other. In FIG. 22, elements corresponding to those in FIG. 3 are designated by the same reference numerals and descriptions thereof are omitted.

Figure 23:
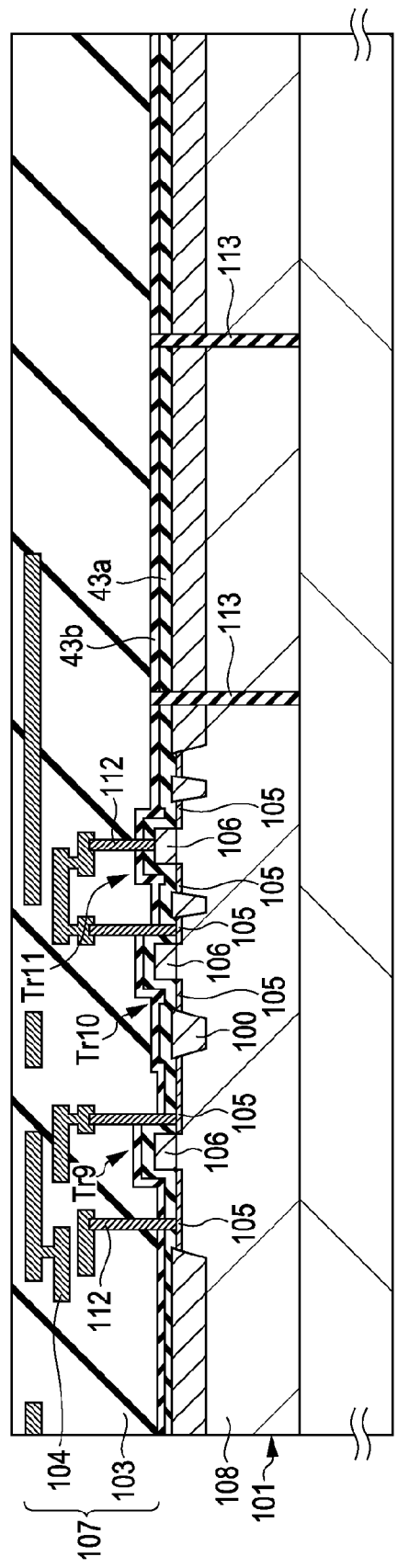
FIG. 23 shows a method for manufacturing the solid-state image pickup device that is consistent with the present invention.

In the third embodiment, first, as shown in FIG. 23, on a region to be formed into each chip portion of the first semiconductor substrate (semiconductor wafer) 101, a semi-finished first semiconductor integrated circuit, that is, a logic circuit in this embodiment, is formed. That is, on a region to be formed into each chip portion of a semiconductor well region 108 formed in the first semiconductor substrate 101 composed of silicon, a plurality of MOS transistors Tr9, Tr10, and Tr11 are formed. The MOS transistors Tr9 to Tr11 are each formed of source/drain regions 105 and a gate electrode 106 formed on a gate insulating film. The MOS transistors Tr9 to Tr11 are isolated from each other by an element isolation region 100.

Although a plurality of MOS transistors is formed, in FIG. 23, the MOS transistors Tr9 to Tr11 are shown as representatives thereof. The logic circuit may be formed by a CMOS transistor. Hence, as the MOS transistors Tr9 to Tr11, an n-channel MOS transistor or a p-channel MOS transistor may be formed. Hence, when an n-channel MOS transistor is formed, n-type source/drain regions are formed in a p-type semiconductor well region. When a p-channel MOS transistor is formed, p-type source/drain regions are formed in an n-type semiconductor well region.

In addition, as the first semiconductor integrated circuit, instead of the logic circuit a semiconductor memory circuit may also be used. In this case, the second semiconductor integrated circuit which will be described later is used as a logic circuit for signal processing of the semiconductor memory circuit.

In addition, after a second insulating thin film 43b is formed, as in the first embodiment, an insulating spacer layer 113 is formed which isolates a desired region in the semiconductor well region 108 of the first semiconductor substrate 101. The insulating spacer layer 113 is formed such that after the second insulating thin film 43b is formed, an opening is formed in the first semiconductor substrate 101 at a desired position from the rear surface side thereof, and an insulating material is filled in the opening. This insulating spacer layer 113 is a layer formed in a region surrounding an inter-substrate wire 115 shown in FIG. 22.

Next, a plurality of layers, that is, three layers of copper wires 104 in this embodiment, are laminated to each other with interlayer insulating films 103 interposed therebetween, so that a multilayer wire layer 107 is formed on the first semiconductor substrate 101. In this embodiment, although the case in which the wires forming the multilayer wire layer 107 are composed of copper is described by way of example, the metal wire may be formed of another metal material. The multilayer wire layer 107 may be formed in a manner similar to that of the first embodiment. In addition, the MOS transistors Tr9 to Tr11 are each connected to a necessary first-layer copper wire 104 with a connection conductor 112 interposed therebetween. In addition, the three layers of copper wires 104 are connected to each other with the connection conductors 112 interposed therebetween.

Figure 24:
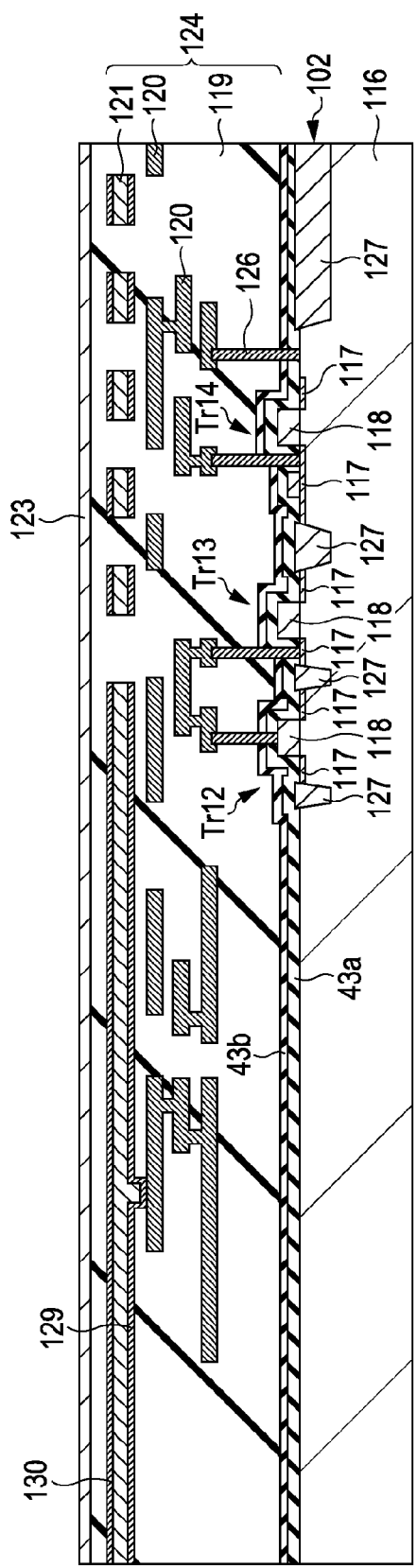
FIG. 24 shows a method for manufacturing the solid-state image pickup device that is consistent with the present invention.

In addition, as shown in FIG. 24, on a region to be formed into each chip portion of the second semiconductor substrate (semiconductor wafer) 102, a semi-finished second semiconductor integrated circuit, that is, a logic circuit, is formed. That is, as in the case shown in FIG. 23, on a region to be formed into each chip portion of a semiconductor well region 116 formed in the second semiconductor substrate 102 composed of silicon, a plurality of MOS transistors Tr12, Tr13, and Tr14 is formed. The MOS transistors Tr12 to Tr14 are each formed of source/drain regions 117 and a gate electrode 118 formed on a gate insulating film. In addition, the MOS transistors Tr12 to Tr14 are isolated from each other by an element isolation region 127.

Although a plurality of MOS transistors is formed, in FIG. 24, the MOS transistors Tr12 to Tr14 are shown as representatives thereof. The logic circuit may be formed by a CMOS transistor. Hence, as these MOS transistors, an re-channel MOS transistor or a p-channel MOS transistor may be formed. Accordingly, when an n-channel MOS transistor is formed, n-type source/drain regions are formed in a p-type semiconductor well region. When a p-channel MOS transistor is formed, p-type source/drain regions are formed in an n-type semiconductor well region.

Next, a plurality of layers, that is, four layers of metal wires in this example, are laminated to each other with interlayer insulating films 119 interposed therebetween, so that a multilayer wire layer 124 is formed on the second semiconductor substrate 102. In this embodiment, three layers of copper wires 120 and one layer of an aluminum wire 121 as the topmost layer are formed. The MOS transistors Tr12 to Tr14 are each connected to a necessary first-layer copper wire 120 with a connection conductor 126 interposed therebetween. In addition, the three layers of copper wires 120 and the aluminum wire 121 are connected to each other with the connection conductors 126. Furthermore, also in this embodiment, barrier metal layers 129 and 130 are formed on the bottom and the top of the aluminum wire 121, respectively, and the aluminum wire 121 is connected to a lower-layer copper wire 120 with the bottom barrier metal layer 129 interposed therebetween. This multilayer wire layer 124 may be formed in a manner similar to that of the first embodiment.

In addition, on the multilayer wire layer 124, a stress correction film 123 is formed which reduces a stress generated when the first semiconductor substrate 101 and the second semiconductor substrate 102 are adhered to each other. The stress correction film 123 may also be formed in a manner similar to that of the first embodiment.

Figure 25:
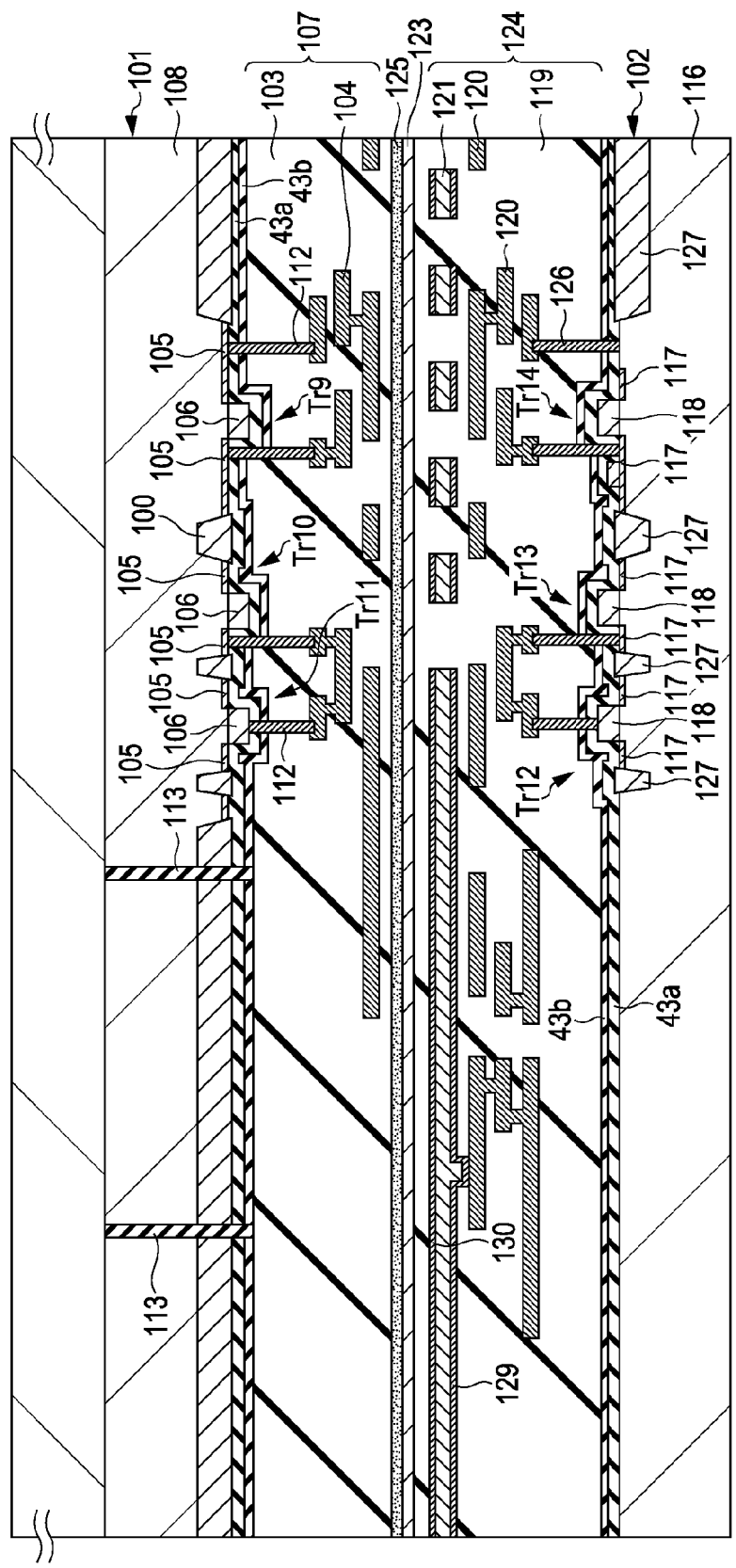
FIG. 25 shows a method for manufacturing the solid-state image pickup device that is consistent with the present invention.

Next, as shown in FIG. 25, the first semiconductor substrate 101 and the second semiconductor substrate 102 are adhered to each other so that the multilayer wire layer 107 faces the multilayer wire layer 124. The adhesion is performed using an adhesive. When the adhesion is performed using an adhesive, an adhesive layer 125 is formed on one adhesion surface of the first semiconductor substrate 101 or the second semiconductor substrate 102, and with this adhesion layer 125, the two substrates are overlapped with and secured to each other. In this embodiment, although the case in which the first semiconductor substrate 101 and the second semiconductor substrate 102 are adhered to each other with the adhesion layer 125 interposed therebetween is described by way of example, plasma bonding may also be used for adhesion between the two substrates. In the case of plasma bonding, a plasma TEOS film, a plasma SiN film, a SiON film (block film), a SiC film, or the like is formed on each of the bonding surfaces of the first semiconductor substrate 101 and the second semiconductor substrate 102. The bonding surfaces provided with the films mentioned above are processed by a plasma treatment and are then overlapped with each other, and subsequently, an annealing treatment is preformed, so that the two substrates are secured to each other. The adhesion treatment is preferably performed by a low temperature process at a temperature of 400° C. or less in which wires and the like are not adversely influenced. Accordingly, the first semiconductor substrate 101 and the second semiconductor substrate 102 are laminated and adhered to each other, so that a laminate 140*a* formed of the two different types of substrates is formed.

Figure 26:
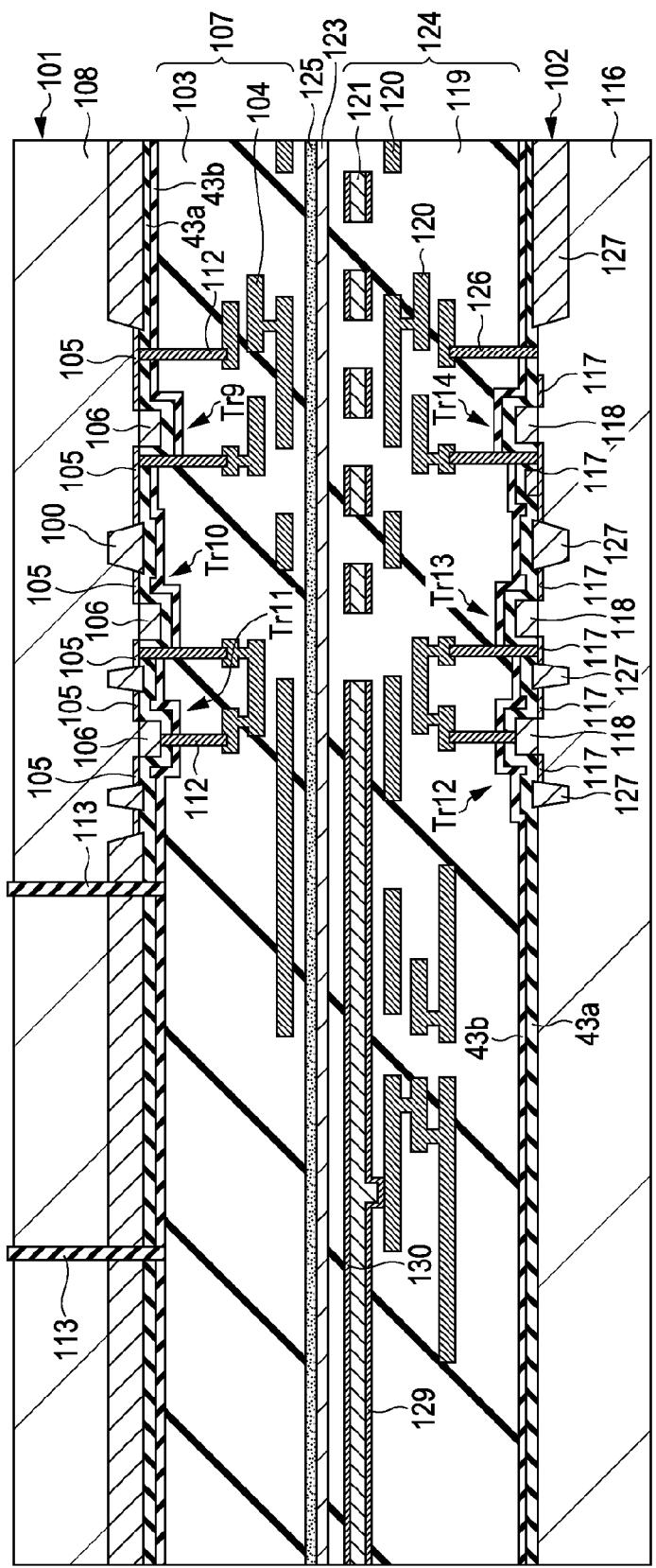
FIG. 26 shows a method for manufacturing the solid-state image pickup device that is consistent with the present invention.

Next, as shown in FIG. 26, the first semiconductor substrate 101 is ground and polished from the rear surface side thereof, so that the thickness of the first semiconductor substrate 101 is reduced. When the first semiconductor substrate 101 has a thickness of approximately 600 µm, the thickness thereof is reduced to approximately 5 to 10 µm.

Figure 27:
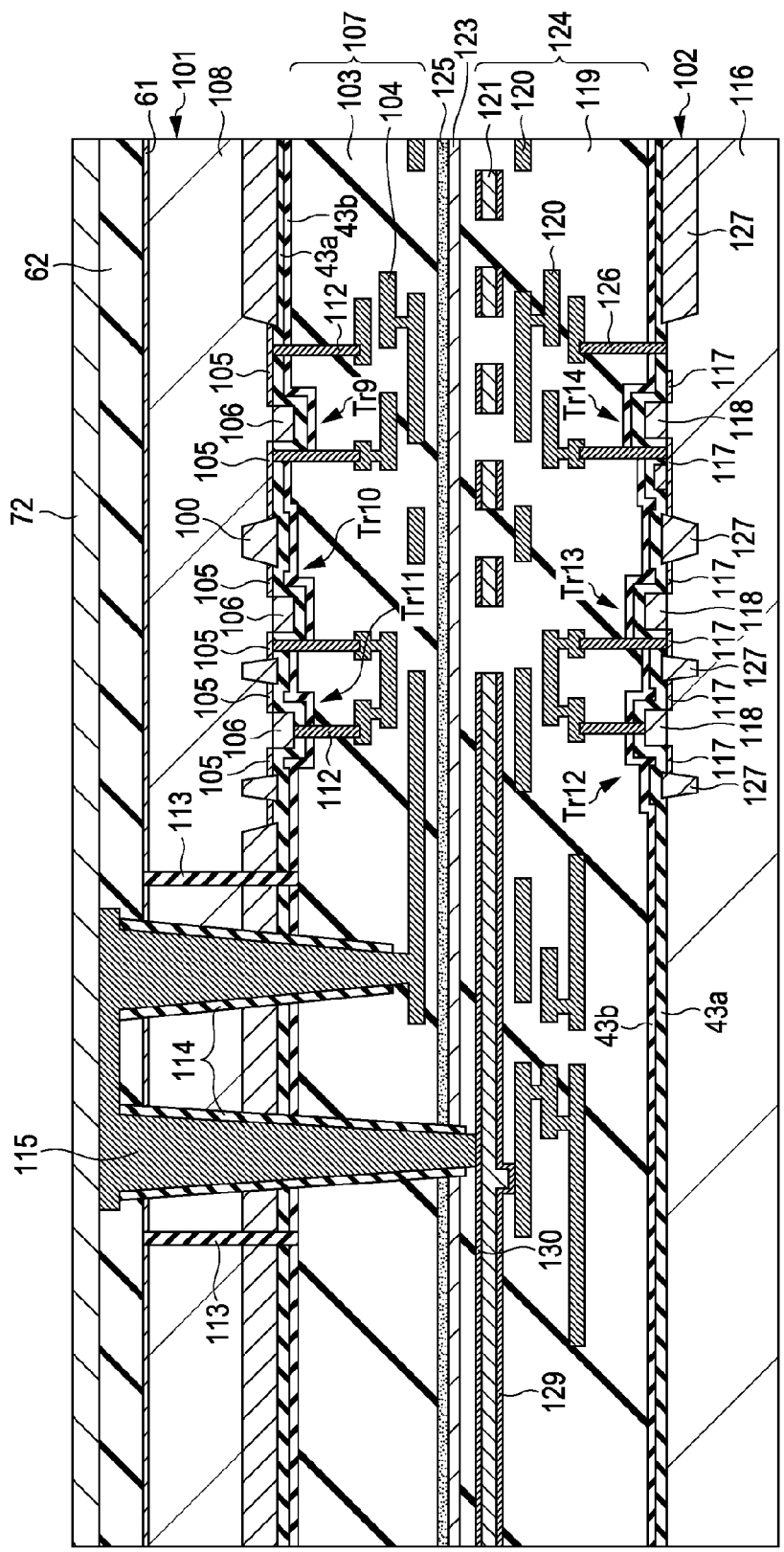
FIG. 27 shows a method for manufacturing the solid-state image pickup device that is consistent with the present invention.

Next, as shown in FIG. 27, after the thickness of the first semiconductor substrate 101 is reduced, by steps similar to those shown in FIGS. 8 to 12 of the first embodiment, an inter-substrate wire 115 is formed in a through substrate via hole and a connection hole formed in the insulating spacer layer 113 with an insulating layer 114 interposed therebetween. In this embodiment, since the through substrate via hole and the connection hole are also formed after the thickness of the first semiconductor substrate 101 is reduced, the aspect ratio of each connection hole is decreased, and hence the connection holes can be each formed as a fine hole. In addition, by the inter-substrate wire 115, the circuit formed on the first semiconductor substrate 101 is electrically connected to the circuit formed on the second semiconductor substrate 102. Subsequently, in a manner similar to that of the first embodiment, a cap film 72 is formed on the entire surface including the inter-substrate wire 115.

Figure 28:
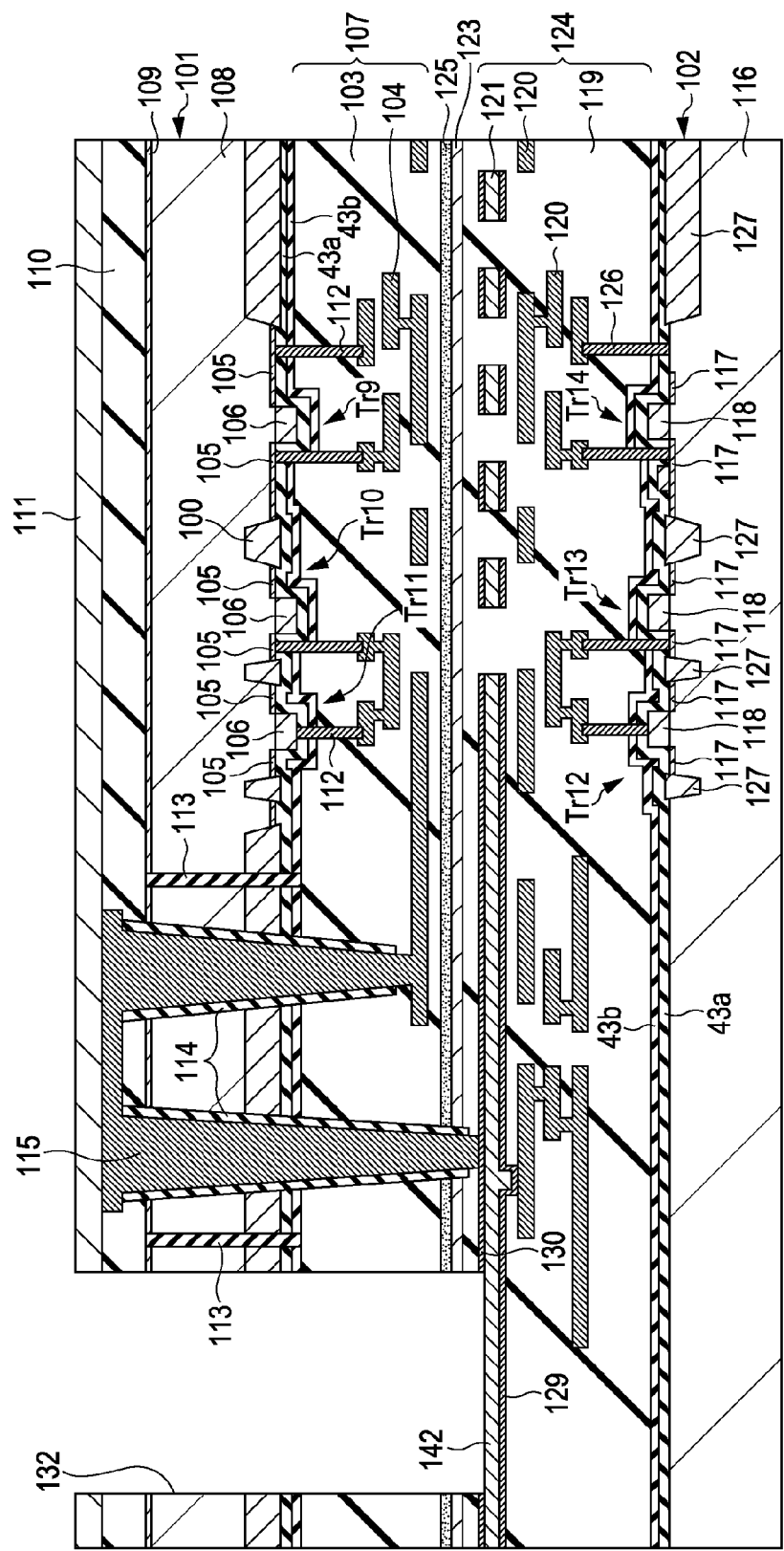
FIG. 28 shows a method for manufacturing the solid-state image pickup device that is consistent with the present invention.

Next, as shown in FIG. 28, a resist film 143 having an opening at an electrode pad portion 142 shown in FIG. 22 is formed. In addition, etching is performed by using the resist film 143 as a mask to form a through substrate opening portion 132 penetrating the first semiconductor substrate 101, so that the aluminum wire 121 is exposed. Hence, the electrode pad portion 142 is formed from the exposed aluminum wire 121. In addition, in this embodiment, as shown in FIG. 20, groove portions each functioning as a crack stopper are also simultaneously formed at two sides of a scribe line when the through substrate opening portion 132 is formed. Subsequently, the laminate thus obtained is divided into chips, so that the semiconductor device 140 of this embodiment shown in FIG. 22 is completed.

In each chip obtained by this division, as shown in FIG. 22, a bonding wire 131 is connected to the electrode pad portion 142, thereby connecting the electrode pad portion 142 to an external wire of a mounting substrate. In addition, since the electrode pad portion 142 is electrically connected to the external wire, the multilayer wire layers 107 and 124 on the first semiconductor substrate 101 and the second semiconductor substrate 102, respectively, which are connected to each other by the inter-substrate wire 115, are also electrically connected to the external wire.

In the semiconductor device 140 according to the third embodiment and the manufacturing method thereof, as in the case described above, the first semiconductor integrated circuit and the second semiconductor integrated circuit can be formed on different chip portions by using optimal process techniques, and hence a high performance semiconductor integrated circuit can be provided. In addition, chips in a finished product state are formed after the semi-finished first and the second semiconductor wafers are adhered to each other, the thickness of one of the wafers is reduced, and the first and the second semiconductor integrated circuits are electrically connected to each other; hence, the manufacturing cost can be reduced.

Furthermore, advantages similar to those of the first embodiment can also be obtained.

The above solid-state image pickup device according to an embodiment of the present invention may be applied to an electronic apparatus including a camera system, such as a digital camera or a video camera, a mobile phone having an image pickup function, and another apparatus having an image pickup function.

Figure 29:
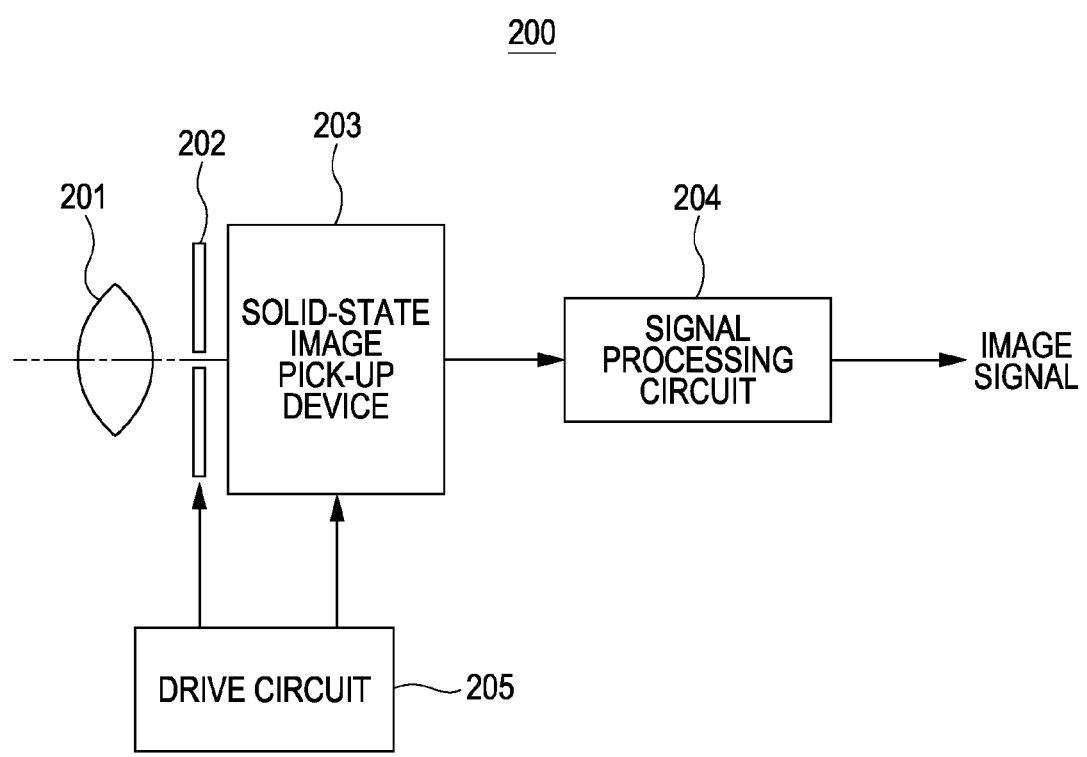
FIG. 29 is a schematic structural view consistent with the present invention that depicts an electronic apparatus according to a fourth embodiment of the present invention.

In FIG. 29, a schematic structural view of an electronic apparatus according to a fourth embodiment of the present invention is shown. FIG. 29 shows a camera 200 by way of example as the electronic apparatus according to an embodiment of the present invention. The camera 200 of this embodiment is a camera capable of taking a still image or a motion picture. The camera 200 of this embodiment includes a solid-state image pickup device 203, an optical system 201 guiding incident light to a photoelectric conversion portion formed of a photodiode of the solid-state image pickup device 203, and a shutter device 202. Furthermore, the camera 200 includes a drive circuit 205 driving the solid-state image pickup device 203 and a signal processing circuit 204 processing an output signal of the solid-state image pickup device 203.

For the solid-state image pickup device 203, one of the solid-state image pickup devices according to the first and the second embodiments is used. The optical system (optical lens) 201 forms an image on an image surface of the solid-state image pickup device 203 by image light (incident light) from an object. Accordingly, a signal charge is stored in the solid-state image pickup device 203 for a predetermined period. The optical system 201 may be an optical lens system formed of a plurality of optical lenses. The shutter device 202 controls a light radiation period and a light shielding period for the solid-state image pickup device 203.

The drive circuit 205 supplies drive signals to control a transfer motion of the solid-state image pickup device 203 and a shutter motion of the shutter device 202. By a drive signal (timing signal) supplied from the drive circuit 205, signal transfer of the solid-state image pickup device 203 is performed. The signal processing circuit 204 performs various types of signal processings. An image signal treated by signal processing is stored in a storage medium, such as a memory, or is output on a monitor.

According to the electronic apparatus, such as the camera 200, of the fourth embodiment, improvement in performance can be performed by the solid-state image pickup device 203, and in addition, the manufacturing cost can be reduced. Hence, in this embodiment, a highly reliable electronic apparatus can be provided at an inexpensive price.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising:
   a first semiconductor section including a first multilayer wiring layer at one side thereof, the first semiconductor section further including a photodiode and at least one transistor;
   a second semiconductor section including a second multilayer wiring layer at one side thereof, the first and second semiconductor sections being secured together with a bonding layer between the first and second multilayer wiring layers such that sides of the respective first and second multilayer wiring layers of the first and second semiconductor sections face each other;
   a first conductor disposed in a first area and extending through the first semiconductor section and the bonding layer to a first connection point in the second multilayer wiring layer of the second semiconductor section such that the first multilayer wiring layer is in electrical communication with the second multilayer wiring layer; and
   a second conductor disposed in a second area other than the first area, and extending through the first semiconductor section and the bonding layer to a second connection point in the second multilayer wiring layer of the second semiconductor section such that the second multilayer wiring layer is in electrical communication with an external wire,
   wherein,
      the first connection point and the second connection point are in a same layer of the second multilayer wiring layer.

2. The semiconductor device of claim 1, wherein the bonding layer is an adhesive layer.

3. The semiconductor device of claim 1, wherein the second multilayer wiring layer includes an aluminum wire in contact with the first conductor and the second conductor.

4. The semiconductor device of claim 3, wherein the first multilayer wiring layer includes a copper wire and the first conductor is in contact with the copper wire.

5. The semiconductor device of claim 1, further comprising a stress reduction film between the first multilayer wiring layer and the second multilayer wiring layer.

6. The semiconductor device of claim 1, further comprising a photodiode in the first semiconductor section on a side of the first semiconductor section opposite the first multilayer wiring layer.

7. The semiconductor device of claim 6, further comprising a suppression layer over the photodiode.

8. The semiconductor device of claim 7, further comprising an anti-reflection film over the suppression layer.

9. The semiconductor device of claim 1, wherein the first semiconductor section and the second semiconductor section are secured together by plasma bonding.

10. The semiconductor device of claim 1, wherein the second connection point is located where the second conductor contacts an electrode pad portion within the second multilayer wiring layer.

11. The semiconductor device of claim 1, wherein the second area extends through a film layer disposed above a side of the first semiconductor section opposite to the first multilayer wiring layer.

12. A method of manufacturing a semiconductor device including the steps of:
   forming a first semiconductor section including a first multilayer wiring layer at one side thereof, the first semiconductor section further including a photodiode and at least one transistor;
   forming a second semiconductor section including a second multilayer wiring layer at one side thereof;
   securing the first semiconductor section to the second semiconductor section with a bonding layer between the first and second multilayer wiring layers such that sides of the respective first and second multilayer wiring layers of the first and second semiconductor sections face each other;
   providing a first conductor disposed in a first area and extending through the first semiconductor section and the bonding layer to a first connection point in the second multilayer wiring layer of the second semiconductor section such that the first multilayer wiring layer is in electrical communication with the second multilayer wiring layer; and
   forming a second conductor disposed in a second area other than the first area, and extending through the first semiconductor section and the bonding layer to a second connection point in the second multilayer wiring layer of the second semiconductor section such that the second multilayer wiring layer is in electrical communication with an external wire,
   wherein,
      the first connection point and the second connection point are in a same layer of the second multilayer wiring layer.

13. The method of claim 12, wherein the first semiconductor section and the second semiconductor section are secured together by means of adhesion.

14. The method of claim 12, wherein the second multilayer wiring layer includes an aluminum wire.

15. The method of claim 14, wherein the first conductor and the second conductor are in contact with the aluminum wire.

16. The method of claim 12, further including forming a photodiode in the first semiconductor section on a side of the first semiconductor section opposite the first multilayer wiring layer.

17. The method of claim 16, further including etching the side of the first semiconductor section furthest from the second semiconductor section such that a thin layer remains over the photodiode.

18. The method of claim 12, wherein the first semiconductor section and the second semiconductor section are secured together by plasma bonding.

19. The method of claim 12, further including providing a stress reduction film between the first multilayer wiring layer and the second multilayer wiring layer.

20. A semiconductor device comprising:
- a first semiconductor section including a first multilayer wiring layer on one side and a device layer on an opposite side thereof, the first semiconductor section further including a photodiode and at least one transistor;
- a second semiconductor section including a second multilayer wiring layer at one side thereof, the first and second semiconductor sections being secured together with a bonding layer between the first and second multilayer wiring layers such that sides of the respective first and second multilayer wiring layers of the first and second semiconductor sections face each other;
- a first conductor disposed in a first area and extending through the device layer of the first semiconductor section to a first connection point in the first multilayer wiring layer of the first semiconductor section;
- a second conductor disposed in a second area and extending through the first semiconductor section and the bonding layer to a second connection point in the second multilayer wiring layer of the second semiconductor section such that the first multilayer wiring layer and the second multilayer wiring layer are in electrical communication;
- a third conductor disposed in a third area other than the first and second areas, that extends through the first semiconductor section and the bonding layer to a third connection point in the second multilayer wiring layer of the second semiconductor section such that the second multilayer wiring layer is in electrical communication with an external wire, wherein,
  the second connection point and the third connection point are in a same layer of the second multilayer wiring layer.

21. The semiconductor device of claim 20, wherein the bonding layer is an adhesive.

* * * * *